(12) United States Patent
Zeidler et al.

(10) Patent No.: US 11,645,740 B2
(45) Date of Patent: May 9, 2023

(54) METHOD FOR DETECTOR EQUALIZATION DURING THE IMAGING OF OBJECTS WITH A MULTI-BEAM PARTICLE MICROSCOPE

(71) Applicant: Carl Zeiss MultiSEM GmbH, Oberkochen (DE)

(72) Inventors: Dirk Zeidler, Oberkochen (DE); Michael Behnke, Eislingen (DE); Stefan Schubert, Oberkochen (DE); Christof Riedesel, Aalen (DE)

(73) Assignee: Carl Zeiss MultiSEM GmbH, Oberkochen (DE)

( * ) Notice: Subject to any disclaimer, the term of this patent is extended or adjusted under 35 U.S.C. 154(b) by 0 days.

(21) Appl. No.: 17/192,637

(22) Filed: Mar. 4, 2021

(65) Prior Publication Data

US 2021/0192700 A1 Jun. 24, 2021

Related U.S. Application Data

(63) Continuation of application No. PCT/DE2019/000194, filed on Jul. 22, 2019.

(30) Foreign Application Priority Data

Sep. 21, 2018 (DE) .......................... 102018007455.3

(51) Int. Cl.
*G06T 5/00* (2006.01)
*H01J 37/00* (2006.01)
(Continued)

(52) U.S. Cl.
CPC ............... *G06T 5/009* (2013.01); *G06T 5/40* (2013.01); *G06T 5/50* (2013.01); *H01J 37/244* (2013.01);
(Continued)

(58) Field of Classification Search
CPC ......... G06T 5/40; G06T 5/009; G06T 3/4038; G06T 5/50; G06T 2207/10061;
(Continued)

(56) References Cited

U.S. PATENT DOCUMENTS 4,130,761 A 12/1978 Matsuda
4,153,843 A 5/1979 Pease
(Continued)

FOREIGN PATENT DOCUMENTS

CN 106643669 A 5/2017
DE 10 2013 014 976 3/2015
(Continued)

OTHER PUBLICATIONS

Translation of International Search Report for corresponding PCT Appl No. PCT/DE2019/000194, dated Feb. 24, 2020.
(Continued)

*Primary Examiner* — Zhihan Zhou
(74) *Attorney, Agent, or Firm* — Fish & Richardson P.C.

(57) ABSTRACT

A method for detector equalization during the imaging of objects with a multi-beam particle microscope includes performing an equalization on the basis of individual images in or on the basis of overlap regions. For detector equalization, contrast values and/or brightness values are used and iterative methods can be employed.

21 Claims, 15 Drawing Sheets

(51) Int. Cl.
  *G06T 5/40* (2006.01)
  *G06T 5/50* (2006.01)
  *H01J 37/244* (2006.01)
  *H01J 37/28* (2006.01)

(52) U.S. Cl.
  CPC .... *H01J 37/28* (2013.01); *G06T 2207/10061* (2013.01); *H01J 2237/2443* (2013.01); *H01J 2237/24445* (2013.01); *H01J 2237/2811* (2013.01)

(58) Field of Classification Search
  CPC ............. H01J 37/28; H01J 2237/24445; H01J 2237/2811; H01J 2237/2443; H01J 37/244
  See application file for complete search history.

(56) References Cited

U.S. PATENT DOCUMENTS

| | | |
|---|---|---|
| 4,200,794 A | 4/1980 | Newberry |
| 4,338,548 A | 7/1982 | Bono |
| 4,742,234 A | 5/1988 | Feldman |
| 5,215,623 A | 6/1993 | Takahashi |
| 5,864,142 A | 1/1999 | Muraki |
| 5,892,224 A | 4/1999 | Nakasuji |
| 5,905,267 A | 5/1999 | Muraki |
| 5,981,954 A | 11/1999 | Muraki |
| 6,107,636 A | 8/2000 | Muraki |
| 6,124,599 A | 9/2000 | Muraki |
| 6,137,113 A | 10/2000 | Muraki |
| 6,323,499 B1 | 11/2001 | Muraki |
| 6,333,508 B1 | 12/2001 | Katsap |
| 6,617,595 B1 | 9/2003 | Okunuki |
| 6,633,366 B2 | 10/2003 | De Jager |
| 6,696,371 B2 | 2/2004 | Butschke |
| 6,787,780 B2 | 9/2004 | Hamaguchi |
| 6,804,288 B2 | 10/2004 | Haraguchi |
| 6,818,911 B2 | 11/2004 | Tamamori |
| 6,835,508 B2 | 12/2004 | Butschke |
| 6,872,950 B2 | 3/2005 | Shimada |
| 6,903,345 B2 | 6/2005 | Ono |
| 6,903,353 B2 | 6/2005 | Muraki |
| 6,917,045 B2 | 7/2005 | Hashimoto |
| 6,919,574 B2 | 7/2005 | Hashimoto |
| 6,943,349 B2 | 9/2005 | Adamec |
| 6,953,938 B2 | 10/2005 | Iwasaki |
| 6,992,290 B2 | 1/2006 | Watanabe |
| 7,005,658 B2 | 2/2006 | Muraki |
| 7,015,467 B2 | 3/2006 | Maldonado |
| 7,060,984 B2 | 6/2006 | Nagae |
| 7,084,411 B2 | 8/2006 | Lammer-Pachlinger |
| 7,091,504 B2 | 8/2006 | Wieland |
| 7,109,494 B2 | 9/2006 | Ono |
| 7,126,141 B2 | 10/2006 | Ono |
| 7,129,502 B2 | 10/2006 | Kruit |
| 7,244,949 B2 | 7/2007 | Knippelmeyer |
| 7,285,779 B2 | 10/2007 | Litman |
| 7,375,326 B2 | 5/2008 | Sender |
| 7,420,164 B2 | 9/2008 | Nakasuji |
| 7,468,507 B2 | 12/2008 | Rogers |
| 7,504,622 B2 | 3/2009 | Elyasaf |
| 7,535,001 B2 | 5/2009 | Sender |
| 7,601,972 B2 | 10/2009 | Nakasuji |
| 7,619,203 B2 | 11/2009 | Elyasaf |
| 7,696,497 B2 | 4/2010 | Rogers |
| 8,035,082 B2 | 10/2011 | Yamazaki |
| 8,134,135 B2 | 3/2012 | Kruit |
| 8,350,214 B2 | 1/2013 | Otaki |
| 8,362,425 B2 | 1/2013 | Han |
| 8,384,051 B2 | 2/2013 | Ozawa |
| 8,598,525 B2 | 12/2013 | Zeidler |
| 8,618,496 B2 | 12/2013 | Wieland |
| 8,704,192 B2 | 4/2014 | Sano |
| 8,748,842 B2 | 6/2014 | Ohashi |
| 8,779,399 B2 | 7/2014 | Yamanaka |
| 8,829,465 B2 | 9/2014 | Tsunoda |
| 8,963,099 B2 | 2/2015 | Yamada |
| 9,153,413 B2 | 10/2015 | Almogy |
| 9,263,233 B2 | 2/2016 | Zeidler |
| 9,336,981 B2 | 5/2016 | Knippelmeyer |
| 9,336,982 B2 | 5/2016 | Zeidler |
| 9,349,571 B2 | 5/2016 | Kemen |
| 9,368,314 B2 | 6/2016 | Nakasuji |
| 9,530,613 B2 | 12/2016 | Rogers |
| 9,536,702 B2 | 1/2017 | Lang |
| 9,607,805 B2 | 3/2017 | Liu |
| 9,653,254 B2 | 5/2017 | Zeidler |
| 9,702,983 B2 | 7/2017 | Eder |
| 9,922,799 B2 | 3/2018 | Li |
| 9,991,089 B2 | 6/2018 | Mueller |
| 10,062,541 B2 | 8/2018 | Ren |
| 10,141,160 B2 | 11/2018 | Ren |
| 10,354,831 B2 | 7/2019 | Kemen |
| 10,388,487 B2 | 8/2019 | Zeidler |
| 10,535,494 B2 | 1/2020 | Zeidler |
| 10,541,112 B2 | 1/2020 | Schubert |
| 10,586,677 B1 | 3/2020 | Okada |
| 10,600,613 B2 | 3/2020 | Zeidler |
| 10,622,184 B2 | 4/2020 | Knippelmeyer |
| 10,643,820 B2 | 5/2020 | Ren |
| 10,741,355 B1 | 8/2020 | Zeidler |
| 10,811,215 B2 | 10/2020 | Zeidler |
| 10,854,423 B2 | 12/2020 | Sarov |
| 10,879,031 B2 | 12/2020 | Ren |
| 10,896,800 B2 | 1/2021 | Riedesel |
| 2006/0023217 A1 | 2/2006 | Bangalore et al. |
| 2009/0014649 A1 | 1/2009 | Nakasuji |
| 2014/0197325 A1 | 7/2014 | Kato |
| 2015/0371819 A1* | 12/2015 | Li ............................ H01J 37/28 250/310 |
| 2017/0133198 A1 | 5/2017 | Kruit |
| 2019/0333732 A1 | 10/2019 | Ren |
| 2019/0362931 A1* | 11/2019 | Watanabe ............... H01J 37/10 |
| 2020/0211810 A1 | 7/2020 | Zeidler |
| 2020/0243300 A1 | 7/2020 | Zeidler |
| 2020/0373116 A1 | 11/2020 | Zeidler |
| 2021/0005423 A1 | 1/2021 | Zeidler |
| 2021/0035773 A1 | 2/2021 | Zeidler |
| 2021/0210330 A1* | 7/2021 | Verenchikov ......... H01J 49/025 |

FOREIGN PATENT DOCUMENTS

| | | |
|---|---|---|
| GB | 2519511 A | 4/2015 |
| GB | 2521819 A | 7/2015 |
| JP | 59184524 A | 10/1984 |
| JP | 60042825 A | 3/1985 |
| JP | 60105229 A | 6/1985 |
| JP | 61263217 A | 11/1986 |
| JP | 2014229481 A | 12/2014 |
| KR | 101885728 B1 | 8/2018 |
| TW | 201721702 A | 6/2017 |
| WO | WO 2005/024881 A2 | 3/2005 |
| WO | WO 2007/028595 A2 | 3/2007 |
| WO | WO 2007/060017 A2 | 5/2007 |
| WO | WO 2008/028596 A2 | 3/2008 |
| WO | WO 2011/124352 A1 | 10/2011 |
| WO | WO2013032949 A1 | 3/2013 |
| WO | WO 2018/138875 A1 | 8/2018 |
| WO | WO2020057678 A1 | 3/2020 |
| WO | WO2020064035 A1 | 4/2020 |
| WO | WO2020065094 A1 | 4/2020 |
| WO | WO2020070074 A1 | 4/2020 |
| WO | WO2020151904 A2 | 7/2020 |
| WO | WO2020249147 A1 | 12/2020 |

OTHER PUBLICATIONS

AF. Pereira et al., "Creating high-resolution multiscale maps of human tissue using multibeam SEM," PLoS computational biology 121 (2016), p. 1-17.

(56) References Cited

OTHER PUBLICATIONS

AL. Eberle et al., "High-resolution, high-throughput imaging with a multi beam scanning electron microscope," Journal of microscopy 259 (2015), p. 114-120.
Z. Wei et al., "Research on Adaptive Fusion Algorithm for Image Stitching," International Symposium on Intelligent Signal Processing and Communication Systems, China (Nov. 6, 2017).

* cited by examiner

METHOD FOR DETECTOR EQUALIZATION DURING THE IMAGING OF OBJECTS WITH A MULTI-BEAM PARTICLE MICROSCOPE

CROSS-REFERENCE TO RELATED APPLICATIONS

The present application is a continuation of, and claims benefit under 35 USC 120 to, international application PCT/DE2019/000194, filed Jul. 22, 2019, which claims benefit under 35 USC 119 of German Application No. 10 2018 007 455.3, filed Sep. 21, 2018. The entire disclosure of these applications are incorporated by reference herein.

FIELD

The disclosure relates to a method for detector equalization during the imaging of objects with a multi-beam particle microscope. Furthermore, the disclosure relates to a system suitable for carrying out such a method, and to a corresponding computer program product.

BACKGROUND

Just like single-beam particle microscopes, multi-beam particle microscopes can be used to analyse objects on a microscopic scale. Images of an object that represent a surface of the object, for example, can be recorded using these particle microscopes. In this way, for example the structure of the surface can be analysed. While in a single-beam particle microscope a single particle beam of charged particles, such as electrons, positrons, muons or ions, is used to analyse the object, in a multi-beam particle microscope, a multiplicity of particle beams are used for this purpose. The multiplicity of the particle beams, also referred to as a bundle, are directed onto the surface of the object at the same time, as a result of which a significantly larger area of the surface of the object can be scanned and analysed as compared with a single-beam particle microscope within the same period of time.

WO 2005/024 881 A2 discloses a multi-beam particle beam system in the form of an electron microscopy system which operates with a multiplicity of electron beams in order to scan an object to be examined using a bundle of electron beams in parallel. The bundle of electron beams is generated by an electron beam generated by an electron source being directed onto a multi-aperture plate having a multiplicity of openings. One portion of the electrons of the electron beam impinges on the multi-aperture plate and is absorbed there, and another portion of the beam passes through the openings of the multi-aperture plate, such that an electron beam is shaped in the beam path downstream of each opening, the cross section of the electron beam being defined by the cross section of the opening. Furthermore, suitably chosen electric fields provided in the beam path upstream and/or downstream of the multi-aperture plate have the effect that each opening in the multi-aperture plate acts as a lens on the electron beam passing through the opening, such that the electron beams are focused in a plane situated at a distance from the multi-aperture plate. The plane in which the foci of the electron beams are formed is imaged by a downstream optical assembly onto the surface of the object to be examined, such that the individual electron beams impinge on the object in a focused manner as primary beams. There they generate interaction products such as backscattered electrons or secondary electrons emanating from the object, which are shaped to form secondary beams and are directed onto the detector by a further optical assembly. There each of the secondary beams impinges on a separate detector element such that the electron intensities detected by the detector element provide information concerning the object at the location at which the corresponding primary beam impinges on the object. The bundle of primary beams is scanned systematically over the surface of the object in order to generate an electron micrograph of the object in the manner that is customary for scanning electron microscopes.

As already mentioned above, each secondary beam impinges on a separate detector element, or detector element assigned thereto. However, even in the case of detector elements that are identically constructed in principle, these detector elements are normally not 100% identical. Rather, their detector characteristic curves, in particular, can deviate from one another, which can result in different brightness and/or contrast values of individual images, even if exactly the same structure was scanned for the individual images. These differences in brightness and/or in contrast may prove to complicate matters, e.g. if different individual images are intended to be juxtaposed (so-called stitching). Moreover, the differences discussed play a part if dimensions of surface structures extending over a plurality of individual images are intended to be measured. Contour identification can also be made more difficult as a result of the differences in brightness and/or contrast values because here the edges of the individual images could be interpreted incorrectly as a contour.

SUMMARY

The present disclosure seeks to provide a method for detector equalization during the imaging of objects with a multi-beam particle microscope, such that a more accurate analysis of image data and better further processing of image data are made possible.

Accordingly, a first aspect of the disclosure relates to a method for detector equalization during the imaging of objects with a multi-beam particle microscope, the method comprising the following steps:

irradiating, in particular simultaneously irradiating, the object with a multiplicity of primary particle beams, wherein each primary particle beam irradiates a separate individual field region of the object in scanning fashion;

collecting interaction products which emanate from the object on account of the primary particle beams;

projecting the interaction products onto detection regions of a detection unit comprising one detector or comprising a plurality of detectors in such a way that the interaction products emanating from two different individual field regions are projected onto different detection regions, generating individual images from each of the individual field regions on the basis of data which are obtained or have been obtained in each case with the aid of signals from the detection regions;

determining a contrast value for each individual image; and adjusting the detection unit, such that a predetermined multiplicity of the individual images, in particular all of the individual images, have the same contrast value within a defined first limit.

The primary particle beams can be for example electrons, positrons, muons or ions or other charged particles. The individual field regions of the object that are assigned to each primary particle beam are scanned in scanning fashion, e.g. line by line or column by column. In this case, it is possible for the individual field regions to be adjacent to one another or to cover the object or a part thereof in tiling fashion. In this way, it is possible to obtain an image of the object that is as complete and contiguous as possible. Optionally, the individual field regions are embodied in rectangular or square fashion since this is the easiest to realize for the scanning process with the aid of particle radiation. Overall, the individual field regions can be arranged as rectangles in different lines one above another so as to result overall in a hexagonal structure. In this case, the number of primary particle beams is not precisely defined; however, the more primary particle beams are used, the more image information can be obtained per unit time and also the faster the entire surface of the object can be scanned. Moreover, it can be desirable for all the primary particle beams of a multi-beam particle microscope that are maximally available, or the image data attributable to them, are actually used for the described method for detector equalization, but this is not necessarily the case. It can be desirable for the number of particle beams is 3n (n−1)+1, where n is an arbitrary natural number, in the hexagonal case. Other arrangements of the individual field regions, e.g. in a square or rectangular pattern, are likewise possible.

The interaction products can be backscattered electrons or else secondary electrons. In this case, for analysis purposes it is possible for the low-energy secondary electrons to be used for image generation.

The detection unit according to the disclosure can comprise one detector or a plurality of detectors of the same type or of different types. The detection unit can e.g. comprise or consist of one or a plurality of particle detectors. A particle detector can in turn be embodied integrally or in multipartite fashion. However, it is also possible to combine one or a plurality of particle detectors and light detectors with one another, or to connect them in series, in the detection unit.

When adjusting the detection unit in such a way that a predetermined multiplicity or all of the individual images have the same contrast value within a desired accuracy, i.e. within the defined first limit, the output of the detection regions is influenced. Depending on the construction of the detection unit, it may be the case here that separate detectors are actually adjusted, that is to say that a detection region corresponds to a separate detector. However, it is also possible, in the case of a single detector, for respectively different conversion channels to be adjusted and/or equalized separately.

In accordance with an embodiment of the disclosure, the detection unit comprises a particle detector and a plurality of light detectors connected downstream thereof.

Specifically, the particle detector can comprise a scintillator plate having a plurality of detection regions. In this case, projecting the interaction products onto the detection regions of the particle detector is carried out with the aid of a suitable particle optical assembly. In this case, the light signals emitted by the particle detector pass in a suitable manner to a light detector assigned to the respective detection region of the particle detector. It is possible, for example, for the light emitted by a detection region of the particle detector to be coupled into optical fibres via a corresponding light optical assembly, the fibres in turn being connected to the actual light detector. The light detector comprises e.g. a photomultiplier, a photodiode, an avalanche photodiode or other types of suitable light detectors.

In accordance with an alternative embodiment of the disclosure, the detection unit comprises a particle detector, but no light detectors. It is then possible to detect the particles directly, without the detour via photons, for example by their being injected into the depletion layer of a semiconductor, whereby in turn an electron avalanche can then be initiated. This then involves a correspondingly structured semiconductor detector comprising at least one independent conversion unit for each beam.

The individual images are assigned to the individual field regions of the object. Accordingly, the geometric shape of the individual field regions also corresponds to the geometric shape of the individual images. Rectangles or squares are often involved here.

In principle, the situation is that the signals generated via the detectors correspond to an intensity of the particle beams from interaction products. Finally, the individual images are then present—after analogue-to-digital conversion and image acquisition—as a digital data set.

Optionally, the situation is that for determining the contrast value of each individual image, a contribution is made by all individual pixels of the individual image. In this case, it is possible to define a contrast value for an individual image in various ways. What is important here is an expedient definition, which will be discussed in even greater detail later.

Adjusting the detectors, such that a predetermined multiplicity or all of the individual images have the same contrast value within a defined first limit, can be carried out by way of one or more adjustment parameters of the detection unit or of the detectors, respectively. The nature of these parameters is dependent on what kind of detection unit is used. In this case, it is theoretically possible for the predetermined multiplicity or all of the individual images to have the same contrast value within the defined first limit after the detection unit has been adjusted just once. However, it will more often be the case that adjusting the detection unit is carried out in a plurality of steps or method cycles and optionally in a manner becoming finer and finer in order to achieve the same contrast value for the predetermined multiplicity or all of the individual images. In this case, an expedient contrast value of an individual image is optionally chosen as reference. It is also possible to choose a mean contrast value of all the individual images as reference value/target value. In this case, the defined (desired) first limit (accuracy) can e.g. be specified as a range in absolute values or be specified as a deviation in percent from a reference value defined beforehand. In particular, a deviation from a reference value chosen beforehand can be ≤10%, such as ≤5% and ≤1%.

Optionally, the situation is that the method is carried out wholly or partly repeatedly and/or iteratively. In the case of an iterative procedure, extrapolation methods and interpolation methods are employed, in particular, which allow a fine adjustment of the detection unit step by step and optionally in a manner becoming finer and finer.

In accordance with an embodiment of the disclosure, the method furthermore comprises the following steps:
 determining a brightness value for each individual image; and
 adjusting the detection unit, such that a predetermined multiplicity of the individual images, in particular all of the individual images, have the same brightness value within a defined second limit.

This embodiment variant of the disclosure thus involves both the contrast values and the brightness values of all of the individual images being equalized with one another. Brightness values and contrast values of an individual image are closely related to one another anyway, and so an equalization of both variables yields the best results. Brightness and contrast values are defined even more thoroughly further below. In the case of the brightness values, too, the defined second limit (accuracy) can e.g. be specified as a range in absolute values or be specified as a deviation in percent from a reference value defined beforehand. In particular, a deviation from a reference value chosen beforehand can be ≤10%, such as ≤5% and ≤1%.

In accordance with a further embodiment variant of the disclosure, the method furthermore comprises the following method step:

testing the changed settings of the detection unit by again carrying out some or all of the method steps.

The testing can end e.g. after determining the contrast values for each individual image and/or after determining a brightness value for each individual image, namely when the contrast values and/or brightness values thus determined for respectively a predetermined multiplicity, or optionally for all, of the individual images are in each case the same within the predefined limits. In this case, of course, the detection unit need not be adjusted further or more finely. In this context, it is conducive in each case to define a quality criterion as criterion for a successful detector equalization. The quality criterion is then the termination criterion in the case where the method is carried out repeatedly.

In accordance with an embodiment of the disclosure, adjusting the detection unit comprises adjusting a gain and/or adjusting an offset. This can be done for one or for a plurality of detectors or the conversion channels thereof, depending on the construction of the detection unit. In principle, the situation is that detectors for converting particles have two very important adjustment parameters—alongside many other parameters. They are the gain and the offset. They are mapped in the characteristic curve of a detector.

The gain indicates here, in principle, how much output is generated by how much input. Specifically, the gain indicates the number of particles of the second particle species (out) contained in the output in relation to the number of particles of the first particle species (in) contained in the input. In the case of an avalanche photodiode, the input is formed by photons and the output is electrons. The same can analogously be defined for all other detectors, DED ("direct electron detection"), PMT ("photomultiplier tube"), etc. Furthermore, many detectors that carry out conversion into an electrical signal (current or voltage drop across an output resistor) have a post amplifier built in, the gain of which is likewise adjustable.

The offset in turn indicates how high the level of the output signal is if no primary particles arrive. That is generally solved in the downstream electronic circuitry via a voltage adder. Ultimately, leakage currents, etc. are thus compensated for via these systems. Offset and gain are generally not independent of one another.

In accordance with an embodiment of the disclosure, the interaction products are projected onto detection regions of a particle detector, wherein light signals are emitted by each detection region of the particle detector upon interaction products impinging on the detection region, wherein the light signals emitted by each detection region are fed to a light detector assigned to the respective detection region; and wherein adjusting the detection unit comprises adjusting the light detectors.

Moreover, the explanation given above with regard to series connection of particle detector and light detectors is applicable to this embodiment.

In accordance with an embodiment of the disclosure, the light detectors comprise avalanche photo diodes, wherein adjusting the avalanche photodiodes comprises adjusting a gain and/or adjusting an offset. This can be done e.g. by way of a current and/or voltage change, respectively. Avalanche photodiodes are highly sensitive and very fast photodiodes and suited to detecting even low radiation powers and are therefore excellently suitable for use in multi-beam particle microscopes.

If consideration is given to the brightness histograms of the individual images, the latter often exhibit a gaussian distribution or a curve to which a gaussian distribution can be fitted to a good approximation. In accordance with an embodiment variant of the disclosure, then the mean value of a Gaussian distribution or of a fitted gaussian distribution in the brightness histogram is defined as brightness value for each individual image, and/or a multiple of the standard deviation of the Gaussian fitted distribution, in particular 2 sigma in the brightness histogram is defined as contrast value for each individual image. In the case where the brightness histograms do not have a Gaussian-like distribution, the mean value of the brightness histogram or the position of the highest peak of the brightness histogram can be used for the brightness value and, instead of a multiple of the standard deviation, e.g. the full width at half maximum of the highest peak of the brightness histogram can be used for the definition of the contrast value to be achieved. These definitions are particularly stable definitions for a brightness value and primarily for a contrast value. This is because the individual images obtained often have only a single peak in the corresponding brightness histogram. If two separate peaks were present, then the contrast could be expressed very simply as the difference between these two peaks. However, the images obtained with the aid of multi-beam particle microscopes are special images which often do not have precisely this plurality of peaks. Instead, often there is just a single prominent peak present, which sometimes has a weak secondary peak in the form of a shoulder. In this respect, it is desirable to find a definition for the contrast value to be achieved which is stable even in view of these circumstances. The full width at half maximum and very particularly also the width of a Gaussian distribution, in particular 2 sigma of the Gaussian distribution, as a definition for the contrast value have proved to be very stable in this case.

If an avalanche photodiode is used as light detector, then both the contrast of the individual image and the brightness value of the individual image change in the event of a change in the gain of the avalanche photodiode. Both parameters of an individual image that are to be adapted can thus be influenced by way of an adjustment of the gain. By contrast, if the offset of the avalanche photodiode is altered, then the entire brightness histogram is shifted along the X axis. The offset adjustment thus only influences the brightness value. Against this background, it may be expedient, during an adjustment of the avalanche photodiodes, to equalize firstly the contrast and afterwards—by way of an adjustment of the offset—the brightness value.

In accordance with an embodiment of the disclosure, the individual images are generated in parallel on image generating computers respectively assigned to detection regions of the detection unit. During image generation, a one dimensional data stream is converted into a two dimensional data format e.g. with the aid of so called frame grabbers. Very large volumes of data arise here during the generation of the individual images, with the result that parallel processing of the data on different image generating computers can afford considerable advantages in respect of time. In this case, it is possible to provide and use a dedicated assigned image generating computer for each detector. However, it is also possible to generate a plurality of individual images from a corresponding number of detectors on one and the same image generating computer. In the case of present-day computational capacities, it can be advantageous to generate up to 8 individual images on one and the same image generating computer. With use of e.g. 91 primary particle beams, a total of 91 individual images are generated, which can be calculated in parallel e.g. on 12 image generating computers. The large volume of data that arises can be handled very well in this way.

In accordance with an embodiment variant of the disclosure, adjusting the detection unit is controlled by a control computer system. In this case, the control computer system can also control the entire multi-beam particle microscope per se. Here the procedure may e.g. also be such that the contrast values and/or brightness values are determined in the image generating computers and are then transferred from the image generating computers to the control computer system. The control computer system or a control computer assigned thereto then calculates therefrom the desired adjustment or the adaptation of the detection unit. The central evaluation of the contrast values and/or brightness values in the control computer system for the purpose of equalization is in this case particularly expedient since a separate program code or a specific computing program can be used for this equalization.

In accordance with a further embodiment variant of the disclosure, image processing for further improvement of contrast and/or brightness is carried out after the successful detector equalization. Image processing routines known per se can be used for this purpose.

In accordance with a further embodiment of the disclosure, a test sample having a plurality of structurally identical test regions is used as object for the detector equalization. This procedure is based on the concept that such a sample has the same structures for all scanning primary individual beams in each individual field region and the detection signals for all detectors are obtained under identical scanning conditions. Different brightness values and/or contrast values of individual images are then thus primarily attributable to the differences in the detectors, rather than to the constitution of the sample. By way of example, a silicon wafer on which a regular structure has been applied, e.g. using lithographic methods, is used as the test sample.

After a test sample has initially been used as an object for the detector equalization, in a further method step the changed settings of the light detectors can be tested on the basis of a real sample. Here, too, the contrast values and/or brightness values determined should then range in an adequate interval, determined by the predefined limits.

Otherwise, once again carrying out a renewed detector equalization on the basis of the test sample is involved. The reason for carrying out the method iteratively in this way is that the detector adjustment is very sensitively dependent on the secondary electron yield on the real sample. If the secondary electron yield on the real sample differs from the secondary electron yield on the test sample, to an excessively great extent, then a different characteristic curve region of the light detectors is employed when scanning the real sample. For this different characteristic curve region, however, it is then very likely that the detector equalization is no longer fulfilled sufficiently, since the characteristic curves of most detectors have a fundamentally non-linear behaviour that can be approximated linearly with good correspondence only in partial regions. It is therefore also possible to start the entire equalization method for the current real sample using empirical values which were obtained on the basis of a similar or comparable real sample. The use of empirical values as starting value shortens the duration for a successful detector equalization.

In accordance with a second aspect of the disclosure, the latter relates to a method for detector equalization during the imaging of objects with a multi-beam particle microscope, the method comprising the following steps:

defining sample overlap regions between adjacent individual field regions of an object, wherein each sample overlap region is assigned at least two different individual field regions;

irradiating, in particular simultaneously irradiating, the object with a multiplicity of primary particle beams, wherein each primary particle beam irradiates an individual field region and each overlap region assigned to the individual field region in scanning fashion;

collecting interaction products which emanate from the object on account of the primary particle beams;

projecting the interaction products onto detection regions of a detection unit comprising one detector or comprising a plurality of detectors in such a way that the interaction products emanating from two different individual field regions are projected onto different detection regions, generating overlap individual images from each of the overlap regions on the basis of data which are obtained or have been obtained in each case with the aid of signals from the detection regions;

determining a brightness and/or contrast value for each overlap individual image; and adjusting the detection unit such that in each case mutually corresponding overlap individual images have the same brightness and/or contrast value within a defined limit or within defined limits.

The method for detector equalization in accordance with the second embodiment of the disclosure thus does not employ complete individual images, but rather only specific segments thereof. This has the consequence that the method can be carried out more rapidly. Moreover, this method is less sensitive visa vis possible variations of secondary electron yields per individual field region. This is because it may be assumed that the secondary electron yield in the sample overlap regions of adjacent individual field regions is approximately identical or varies to a lesser extent. This is applicable in particular even if—as described above in the case of the first embodiment—a test sample is used for the detector equalization.

In principle, it is possible for the individual field regions to be scanned completely during the detector equalization, but only the data assigned to the overlap regions to be used for the detector equalization. However, it is also possible for only the overlap regions for the detector equalization to be scanned at all.

The aim of the adjustment of the detection unit in accordance with the second embodiment of the disclosure is for overlap individual images respectively assigned to one another to have the same brightness and/or contrast value in each case within a desired, i.e. predefined, accuracy. This does not necessarily mean that all of the overlap individual images have the same brightness and/or contrast value; however, that may be the case, of course. Instead, here a step by step equalization takes place, and the best way to do this is proceeding from a reference detector setting with a good brightness and/or contrast value.

Moreover, regarding other aspects, the explanations already given in association with the first embodiment of the disclosure are applicable to the second embodiment of the disclosure, too.

In accordance with an embodiment of the disclosure, the individual field regions of the sample and the individual images assigned to them are arranged in each case in a tiled manner with respect to one another, and adjusting the detection unit is carried out step by step over the overlap regions of mutually adjacent individual images. Here, too, the individual images can e.g. be rectangular and be arranged in a plurality of rows with respect to one another either from corner to corner or else in a manner displaced relative to one another, wherein in the latter case an overall hexagonal structure of the individual field regions and of the individual images assigned thereto can be produced in a very simple manner.

In accordance with an embodiment, adjusting the detection unit is carried out proceeding from an inner individual image outwards. In this case, therefore, the inner individual image, to put it more precisely the detection region assigned to this individual image, serves as a reference. The method begins with a detector setting with sufficient brightness and/or with sufficiently good contrast. Afterwards, the equalization then again takes place over the overlap regions. If the arrangement of the individual images is chosen suitably, e.g. in the form of rectangles which overall produce a hexagonal structure, then the adjustment of the detection unit with the detectors thereof and/or the conversion units thereof can also be carried out proceeding from a central inner individual image in a shell-like manner from the inner area outwards over the overlap regions. Such a shell-like procedure from the inner area outwards can minimize following errors during the detector equalization. The equalization can thus be carried out with the fewest possible steps overall.

In accordance with an embodiment, all mutually adjacent individual field regions of the sample and the individual images to be assigned to the individual field regions have shared edges and not just shared corner points with one another, and the sample overlap regions and overlap individual images at least partly include the shared edges. This therefore rules out instances in which the individual field regions make contact with one another substantially only at points and in a line-like manner. Specifically, if there are shared edges between adjacent individual field regions of the sample, to put it more precisely individual images to be assigned to the individual field regions, then it is possible to carry out a high-quality equalization over overlap regions by way of the shared edges.

In accordance with a further embodiment variant of the second embodiment of the disclosure, the dimensions of the sample overlap regions and/or overlap individual images are adjustable. Important manipulated variables for this adjustment are e.g. the individual size overall (i.e. the number of pixels and the pixel size) and the distance between the primary individual beams. In this way, the sample overlap regions and/or the overlap individual images can be set such that enough data are present for a successful equalization. Conversely, the recording of superfluous data is possibly avoidable.

Optionally, the sample overlap regions and/or overlap individual images are rectangular. However they can also have other regular or irregular shapes. In this case, the rectangular embodiment variant can significantly improve the scanning process for image generation.

Here, too, overall the situation is that the method can be carried out wholly or partly repeatedly and/or iteratively.

In accordance with an embodiment, adjusting the detection unit again comprises adjusting a gain and/or adjusting an offset. Here, too, the detection unit can comprise particle detector(s) and light detectors. Optionally, here, too, the light detectors comprise avalanche photodiodes and adjusting the avalanche photodiodes comprises a voltage change and/or current change.

Moreover, reference is made to the embodiments and possible embodiment variants implemented with regard to the first embodiment of the disclosure in order, at this juncture, to avoid unnecessary repetitions in the description of the second embodiment.

In accordance with a further aspect of the disclosure, the latter relates to a system comprising the following:
- a multi-beam particle microscope comprising a multi-beam particle optical assembly comprising a detection unit;
- at least one, optionally a plurality of, image generating computer(s); and
- a control computer system,
- wherein the constituents of the system are configured to carry out the method in accordance with either of the two embodiment variants described above.

Optionally, in this case, the control computer system controls the actual multi-beam particle microscope. The image generating computers are substantially provided for image generation and they can also calculate the contrast values and/or brightness values of the individual images or of the overlap individual images and transfer them to the control computer system for the actual detector equalization routine.

In accordance with a further aspect of the disclosure, the latter relates to a computer program product comprising a program code for carrying out the described methods for detector equalization during the imaging of objects with a multi-beam particle microscope. In this case, the program code can be subdivided into one or more partial codes. It is appropriate, for example, to provide the code for controlling the multi-beam particle microscope separately in one program part, while another program part contains the routines for the actual detector equalization.

The above described embodiment variants of the disclosure can be combined wholly or partly with one another, provided that no technical contradictions arise as a result. This also applies to a combination of features from the first and second embodiments of the disclosure with one another.

BRIEF DESCRIPTION OF THE DRAWINGS

The disclosure will be understood even better with reference to the accompanying figures, in which.

DETAILED DESCRIPTION

Figure 1:
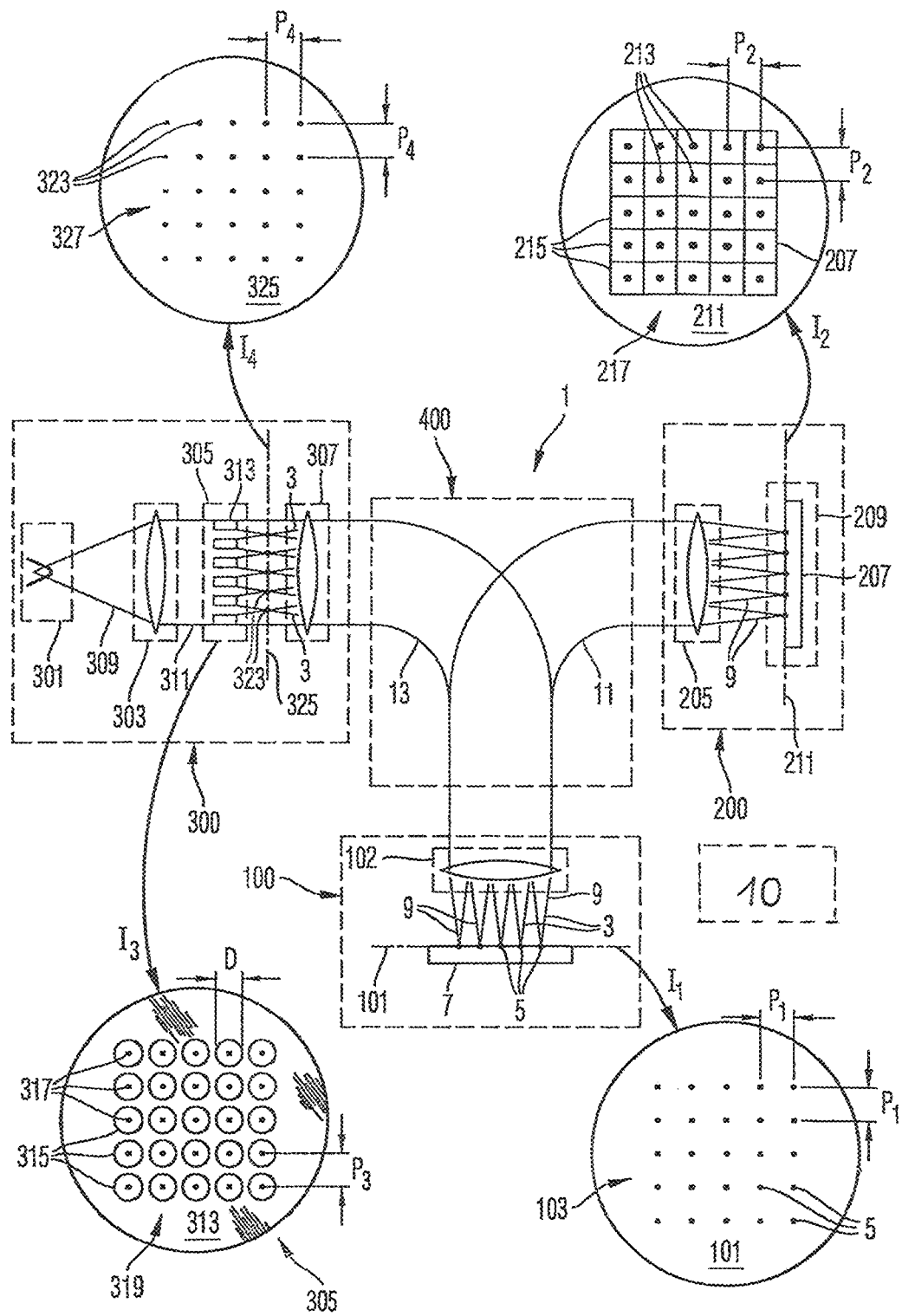
FIG. 1 shows a multi-beam particle microscope in a schematic illustration.

FIG. 1 is a schematic illustration of a particle beam system 1 in the form of a multi-beam particle microscope 1, which uses a multiplicity of particle beams. The particle beam system 1 generates a multiplicity of particle beams which impinge on an object to be examined in order to generate there interaction products, e.g. secondary electrons, which emanate from the object and are subsequently detected. The particle beam system 1 is of the scanning electron microscope (SEM) type, which uses a plurality of primary particle beams 3 which impinge at a plurality of locations 5 on a surface of the object 7 and generate there a plurality of electron beam spots, or spots, that are spatially separated from one another. The object 7 to be examined can be of any desired type, e.g. a semiconductor wafer or a biological sample, and comprise an arrangement of miniaturized elements or the like. The surface of the object 7 is arranged in a first plane 101 (object plane) of an objective lens 102 of an objective lens system 100.

The enlarged excerpt $I_1$ in FIG. 1 shows a plan view of the object plane 101 having a regular rectangular array 103 of impingement locations 5 formed in the first plane 101. In FIG. 1, the number of impingement locations is 25, which form a 5×5 array 103. The number 25 of impingement locations is a number chosen for reasons of simplified illustration. In practice, the number of beams and accordingly impingement locations can be chosen to be significantly greater, such as, for example, 20×30, 100×100 and the like.

In the embodiment illustrated, the array 103 of impingement locations 5 is a substantially regular rectangular array having a constant distance $P_1$ between adjacent impingement locations. Exemplary values of the distance $P_1$ are 1 micrometre, 10 micrometres and 40 micrometres. However, it is also possible for the array 103 to have other symmetries, such as a hexagonal symmetry, for example.

A diameter of the beam spots shaped in the first plane 101 can be small. Exemplary values of the diameter are 1 nanometre, 5 nanometres, 10 nanometres, 100 nanometres and 200 nanometres. The focusing of the particle beams 3 for shaping the beam spots 5 is carried out by the objective lens system 100.

The primary particles impinging on the object generate interaction products, e.g. secondary electrons, scattered electrons or primary particles which have experienced a reversal of movement for other reasons, which emanate from the surface of the object 7 or from the first plane 101. The interaction products emanating from the surface of the object 7 are shaped by the objective lens 102 to form secondary particle beams 9. The particle beam system 1 provides a particle beam path 11 for guiding the multiplicity of secondary particle beams 9 to a detector system 200. The detector system 200 comprises a particle optical assembly having a projection lens 205 for directing the secondary particle beams 9 onto a particle multi-detector 209.

The excerpt 12 in FIG. 1 shows a plan view of the plane 211, in which individual detection regions of the particle multi-detector 209 are located on which the secondary particle beams 9 impinge at locations 213. The impingement locations 213 lie in an array 217 with a regular distance $P_2$ with respect to one another. Exemplary values of the distance $P_2$ are 10 micrometres, 100 micrometres and 200 micrometres.

The primary particle beams 3 are generated in a beam generating device 300 comprising at least one particle source 301 (e.g. an electron source), at least one collimation lens 303, a multi-aperture arrangement 305 and a field lens 307. The particle source 301 generates a diverging particle beam 309, which is collimated or at least substantially collimated by the collimation lens 303 in order to shape a beam 311 which illuminates the multi-aperture arrangement 305.

The excerpt 13 in FIG. 1 shows a plan view of the multi-aperture arrangement 305. The multi-aperture arrangement 305 comprises a multi-aperture plate 313 having a plurality of openings or apertures 315 formed therein. Midpoints 317 of the openings 315 are arranged in an array 319 that is imaged onto the array 103 formed by the beam spots 5 in the object plane 101. A distance $P_3$ between the midpoints 317 of the apertures 315 can have exemplary values of 5 micrometres, 100 micrometres and 200 micrometres. The diameters D of the apertures 315 are smaller than the distance $P_3$ between the midpoints of the apertures. Examples of values of the diameters D are $0.2 \times P_3$, $0.4 \times P_3$ and $0.8 \times P_3$.

Particles of the illuminating particle beam 311 pass through the apertures 315 and form particle beams 3. Particles of the illuminating beam 311 which impinge on the plate 313 are absorbed by the latter and do not contribute to the formation of the particle beams 3.

On account of an applied electrostatic field, the multi-aperture arrangement 305 focuses each of the particle beams 3 in such a way that beam foci 323 are formed in a plane 325. A diameter of the beam foci 323 can be for example 10 nanometres, 100 nanometres and 1 micrometre.

The field lens 307 and the objective lens 102 provide a first imaging particle optical assembly for imaging the plane 325, in which the beam foci are formed, onto the first plane 101 such that an array 103 of impingement locations 5 or beam spots arises there. If a surface of the object 7 is arranged in the first plane, the beam spots are correspondingly formed on the object surface.

The objective lens 102 and the projection lens arrangement 205 provide a second imaging particle optical assembly for imaging the first plane 101 onto the detection plane 211. The objective lens 102 is thus a lens which is part of both the first and the second particle optical assembly, while the field lens 307 belongs only to the first particle optical assembly and the projection lens 205 belongs only to the second particle optical assembly.

A beam switch 400 is arranged in the beam path of the first particle optical assembly between the multi-aperture arrangement 305 and the objective lens system 100. The beam switch 400 is also part of the second optical assembly in the beam path between the objective lens system 100 and the detection system 200.

Further information concerning such multi-beam particle beam systems and components used therein, such as, for instance, particle sources, multi-aperture plates and lenses, can be obtained from the international patent applications WO 2005/024881, WO 2007/028595, WO 2008/028596, WO 2011/124352 and WO 2007/060017 and the German patent applications having the application numbers DE 10 2013 026 113.4 and DE 10 2013 014 976.2, the disclosure of which in the full scope thereof is incorporated by reference in the present application.

The multi-beam particle beam system furthermore comprises a computer system 10 configured both for controlling the individual particle optical components of the multi beam particle beam system and for evaluating and analysing the signals obtained by the multi detector 209. In this case, the computer system 10 can be constructed from a plurality of individual computers or corresponding components. In accordance with an embodiment variant, the computer system 10 comprises a control computer system 270 and one or a plurality of image generating computers 280. The provision of a plurality of image generating computers 280 can be advantageous on account of the high volumes of data that arise, and allows detector signals to be evaluated in parallel. The method according to the disclosure for detector equalization can also be carried out with the aid of the computer system 10 described, that is to say that the computer system is configured by a program inter alia for carrying out the method according to the disclosure for detector equalization.

Figure 2:
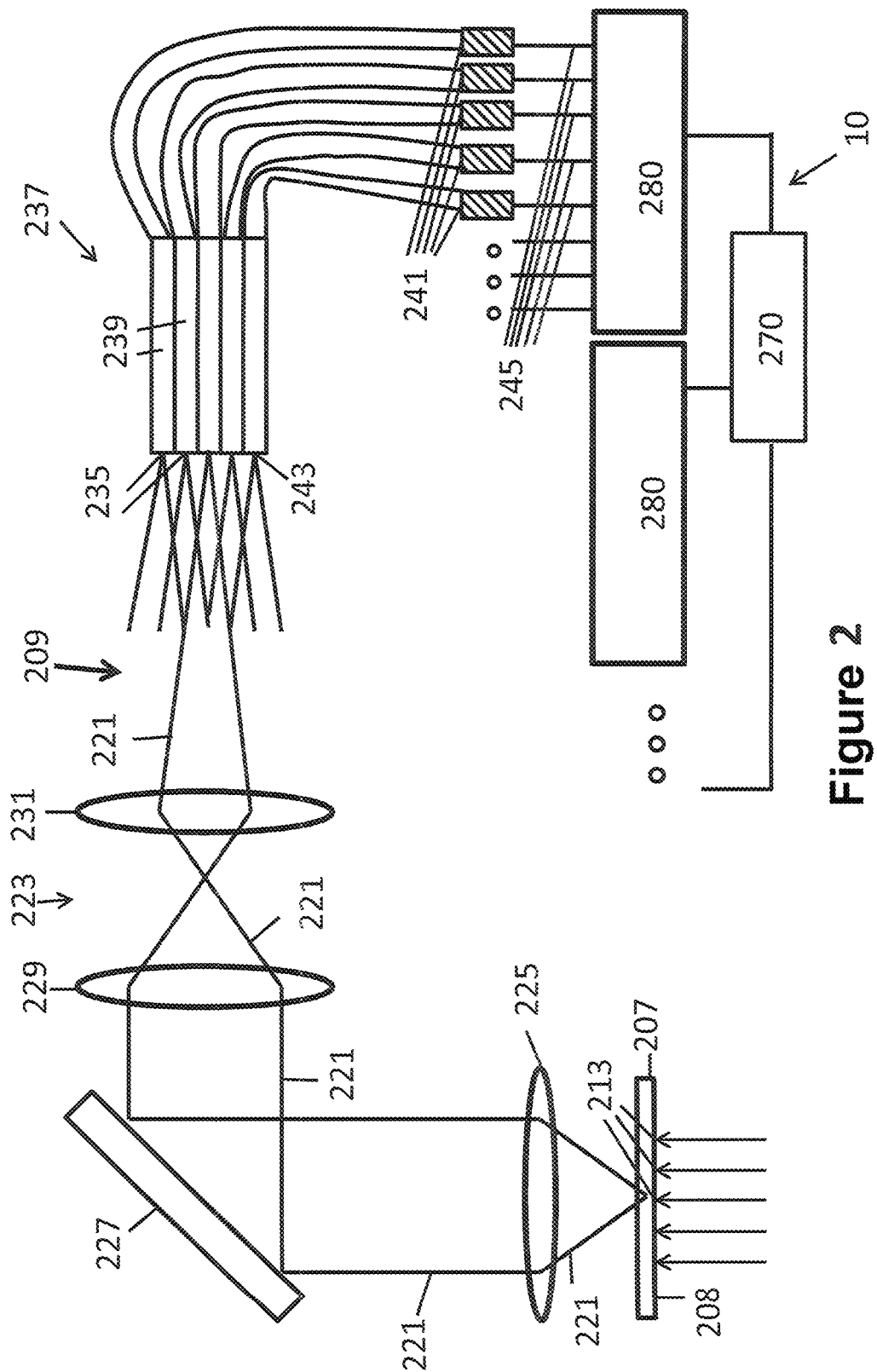
FIG. 2 shows a schematic illustration of a detection system.

FIG. 2 is a schematic illustration for elucidating a number of details of the detector 209. In this case, the detector 209 comprises the scintillator plate 207 as particle detector, onto which scintillator plate the interaction products, for example secondary electron beams, are directed by an electron optical assembly. The electron optical assembly comprises, if it is integrated into the multi-beam particle microscope from FIG. 1, the electron optical components of the particle optical assembly which shape the electron beams 9, i.e. e.g. the objective lens 102, which direct the electron beams 9 towards the detector 209, such as e.g. the beam switch 400, and which focus the electron beams 9 on the surface of the scintillator plate 207, such as e.g. the lens 205. The electron beams 9 impinge on the scintillator plate 207 at impingement locations 213. Even if the electron beams 9 are focused on the surface of the scintillator plate 207, beam spots having diameters that are not arbitrarily small are formed on the surface. The midpoints of the beam spots can be regarded as the impingement locations 213, which are arranged at the distance $P_2$ (cf. FIG. 1) from one another.

The scintillator plate 207 contains a scintillator material, which is excited to emit photons by the impinging electrons of the electron beams 9. Each of the impingement locations 213 thus forms a source of photons. FIG. 2 illustrates just a single corresponding beam path 221 emanating from the impingement location 213 of the central electron beam of the five electron beams 9 illustrated. The beam path 221 passes through a light optical assembly 223, which comprises a first lens 225, a mirror 227, a second lens 229 and a third lens 231 in the example shown, and then impinges on a light receiving surface 235 of a light detection system 237. The light receiving surface 235 is formed by an end face of an optical fibre 239, into which at least one portion of the photons is coupled and guided to a light detector 241. The light detector 241 can comprise e.g. a photomultiplier, an avalanche photodiode, a photodiode or other types of suitable light detectors. The light optical assembly 223 is configured such that it optically images the surface 208 of the scintillator plate 207 into a region 243 in which the light receiving surface 235 is arranged. On account of this optical imaging, optical images of the impingement locations 213 are generated in the region 243. In the region 243, a separate light receiving surface 235 of the light detection system 237 is provided for each of the impingement locations 213. Each of the further light receiving surfaces 235 is formed by an end face of an optical waveguide 239, which guides the light coupled into the end face to a light detector 241. On account of the optical imaging, a light receiving surface 235 is assigned to each of the impingement locations 213, wherein the light entering a respective light receiving surface 235 is detected by a separate light detector 241. The light detectors 241 output electrical signals via signal lines 245. The electrical signals represent intensities of the particle beams 9. Consequently, the locations on the surface of the scintillator plate 207 which are imaged onto the light receiving surfaces of light detectors 241 define different detection points or detection regions. On account of the electron optical assembly described above, interaction products, for example electrons, which emanate from two different individual field regions of an object are also projected onto different detection regions of the scintillator plate 207. In the exemplary embodiment explained here, the light detectors 241 are arranged at a distance from the light receiving surfaces 235, onto which the light optical assembly 223 images the scintillator plate 207, and the received light is guided to the light detectors 241 through optical fibres 239. However, it is also possible for the light detectors 241 to be arranged directly where the light optical assembly generates the image of the scintillator plate and the light sensitive surfaces of the light detectors thus form the light receiving surfaces.

In this case—as stated—FIG. 2 merely schematically elucidates some details of the detector 209. It should still be pointed out at this juncture that by virtue of the scanning movement of the primary particle beams over an object or a sample, many points of the sample are irradiated or scanned. In this case, each primary particle beam 3 sweeps wholly or partly over an individual field region of the object. In this case, each primary particle beam 3 is allocated a dedicated individual field region of the object. From these individual field regions of the object, interaction products, e.g. secondary electrons then in turn emanate from the object. The interaction products are then projected onto the detection regions of the particle detector or onto the scintillator plate 207 in such a way that the interaction products emanating from two different individual field regions are projected onto different detection regions of the scintillator plate 207. Light signals are emanated by each detection region of the scintillator plate 207 upon impingement of the interaction products, e.g. secondary electrons, on the detection region, wherein the light signals emitted by each detection region are fed to a light detector 241 assigned to the respective detection region. In other words, the situation is that each primary particle beam 3 comprises its own detection region on the scintillator and also its own detector channel or light detector 241. Therefore, in the case of the multi-beam particle microscope described, all characteristic curve deviations of the detection regions or detectors are visible in the individual images respectively generated. That means that the brightness and/or the contrast in each individual image may vary owing to the deviations described and that the combined full frame on the basis of all of the primary particle beams has an unsatisfactory appearance until the different detection regions or detectors are equalized with one another with regard to brightness and/or contrast.

Detection architectures other than the one illustrated in FIG. 2 are also suitable for implementing the methods according to the disclosure for detector equalization. Reference is made, for example, to the method of DED ("direct electron detection"), already described further above, which manages without light detectors and in which secondary electrons are directly converted into a current signal.

Figure 3:
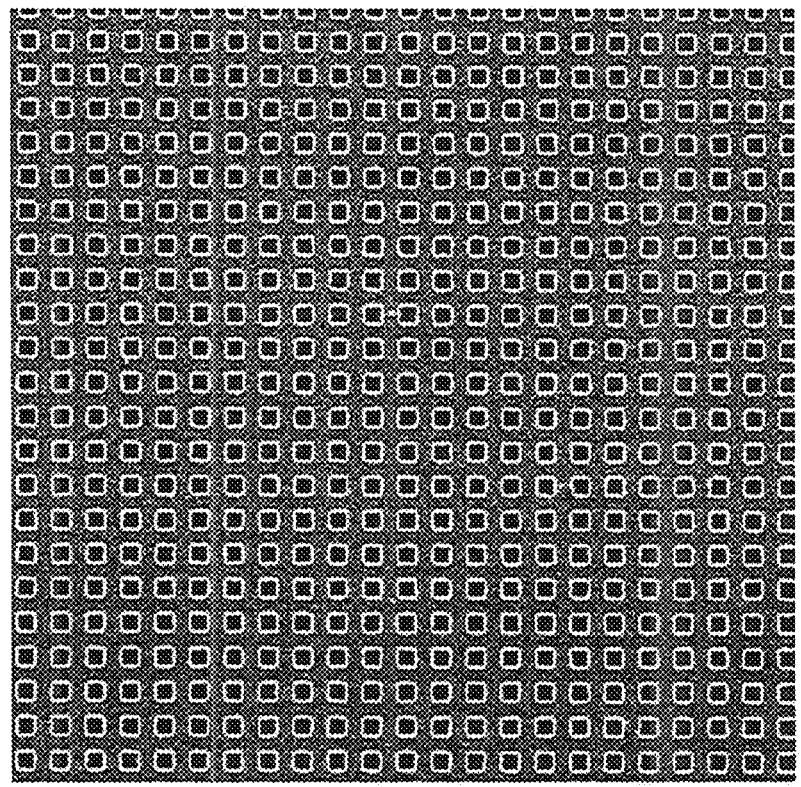
FIG. 3 shows an individual image that has been obtained with the aid of an individual primary beam.

FIG. 3 shows by way of example an individual image that has been obtained on the basis of an individual primary particle beam. In this case, the structure visible in the individual image images the structure of the test sample used. In this case, the individual image has been built up line by line via a corresponding scanning movement of the primary particle beam. In this case, the number of pixels in the individual image is very high and is of the order of magnitude of e.g. approximately 1000×1200 to approximately 8000×9300 pixels. In accordance with an embodiment variant of the disclosure, a corresponding individual image is then generated for each primary particle beam 3. However, these individual images do not all have the same brightness value and the same contrast value. This then forms the starting point for the actual detector equalization.

Figure 4A:
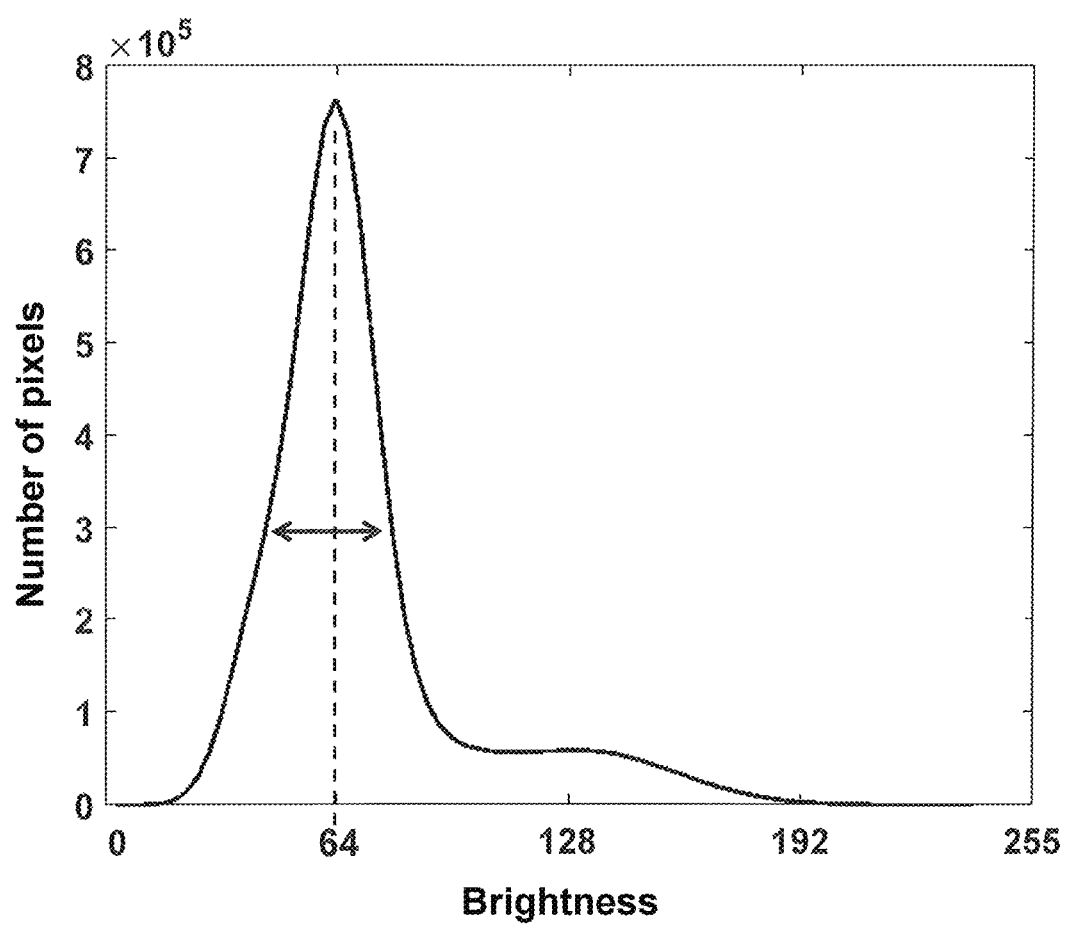
FIG. 4A shows the brightness histogram associated with the individual image in FIG. 3.

For each individual image, an individual image analysis is carried out and a brightness histogram is determined. In the brightness histogram, the brightness, i.e. the grey scale level of the output signal, is plotted on the X axis and the number of pixels in the individual image which have the respective brightness is indicated on the Y axis. A Gaussian distribution or a distribution that can be well approximated by a gaussian distribution typically arises in the histogram in this case. In this case, e.g. the mean value of the Gaussian distribution is defined as the brightness value of the individual image. In FIG. 4A, this value is indicated by the dashed line. By way of example, a multiple of the standard deviation of the Gaussian distribution, for example two sigma of the Gaussian distribution, is defined as the contrast value. In FIG. 4A, this range of two sigma is illustrated by the double headed arrow in the diagram. In the non-Gaussian case, instead of taking account of a multiple of the standard deviation for the contrast value, it is also possible to take account of the full width at half maximum of the peak representing the most frequent brightness values of the individual image.

For detector equalization, the light detectors 241, or to put it more generally the detection unit, are then adjusted such that each individual image has the same contrast value and/or brightness value within the respectively predefined accuracy. To that end, there are typically empirical values indicating the extent to which the setting of the detectors are to be varied in order to achieve a specific change in the contrast and/or brightness. It is useful to start with an expedient initial value and then to carry out a first adaptation or adjustment of the detectors after the first round of evaluation of the contrast values and/or brightness values. This changed setting is then tested by the experimental arrangement being used once again to generate all of the individual images with the new setting of the detectors. Here, too, as described, the new contrast value and/or brightness value are/is determined for each individual image. Comparison of the contrast and/or brightness values before and after the adaptation reveals what degree of change in the detector settings results in what change in contrast value and change in brightness. In this way, the entire method can be repeated iteratively by multiple iterative adjustment and testing. At the end of this iterative process, the predetermined multiplicity of the individual images, or if appropriate all of the individual images, have the same contrast value within the scope of a predefined first accuracy or limit/tolerance and the predetermined multiplicity of the individual images or, if appropriate, all of the individual images optionally have the same brightness value within a second predefined accuracy or limit. In this case, it is possible for a quality criterion to be defined beforehand and used as criterion for a successful detector equalization.

The image shown in FIG. 3 and the brightness histogram illustrated in FIG. 4A were obtained with the aid of avalanche photodiodes as light detectors. In this case, for detector adaptation, as described above, the characteristic curves of the photodiodes, i.e. the gain and the offset, have been adjusted in each case by way of a voltage change or current change. FIG. 4A reveals that the pure detector offset only affects the brightness value. In other words, the curve in the diagram shifts towards the left or right when the offset of the avalanche photodiode is altered. By contrast, if the gain of the detector characteristic curve is altered, then two values change in combination with one another, namely both the brightness value and the standard deviation (two sigma width) of the Gaussian distribution. It may therefore be expedient to equalize firstly the contrast value and only afterwards the brightness value.

Figure 4B:
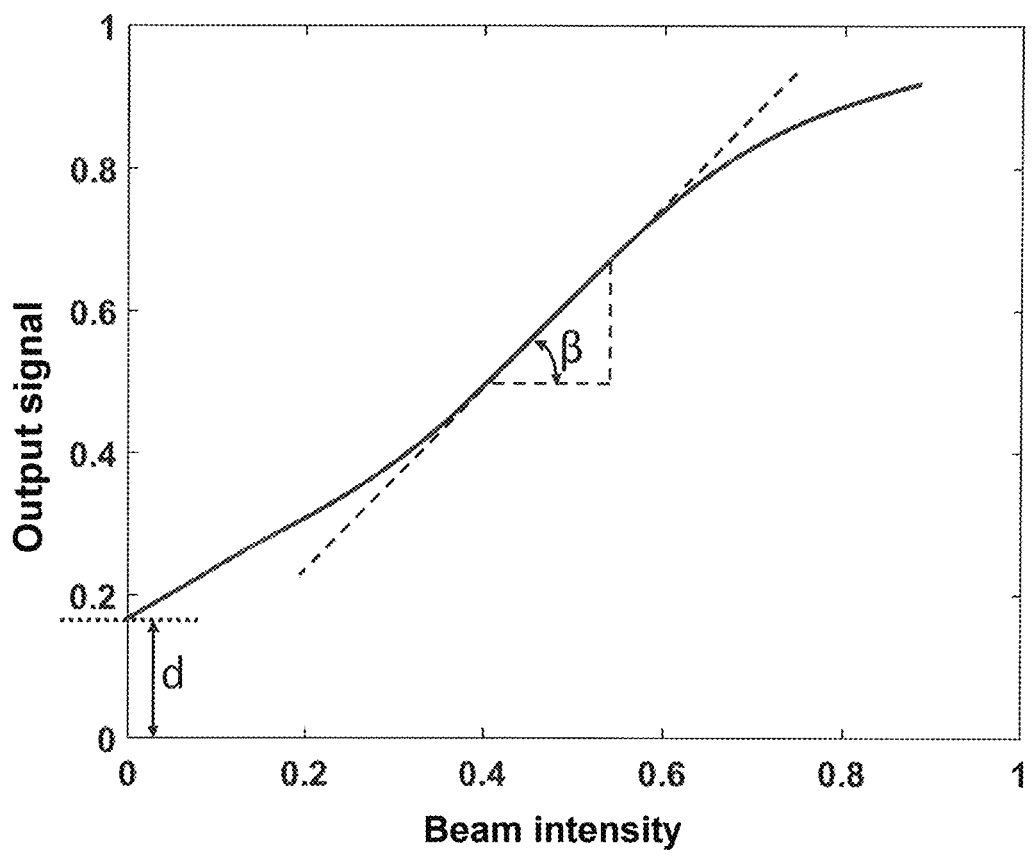
FIG. 4B illustrates a detector characteristic curve.

FIG. 4B illustrates a detector characteristic curve by way of example. The obtained output signal of a detector is plotted against the beam intensity. For illustrative purposes, the axis scalings are normalized in each case to one. It is evident, in principle, that the output signal becomes stronger when the beam intensity increases. In this case, at least in sections there is a linear relationship between the beam intensity and the output signal. In sections, therefore, a straight line can be fitted, i.e. a tangent can be applied, to the characteristic curve shown, wherein the gradient $\beta$ of the tangent describes the gain. The characteristic curve in turn intersects the y axis at a level d. Even without an incoming beam or without photons incident on the detector (depending on the detector), an, albeit weak, output signal is thus obtained. This so called offset d is therefore desirably eliminated, if appropriate, from values for the output signal. The gain $\beta$ and the offset d thus vary when the characteristic curve overall varies. Both the gain $\beta$ and the offset d can thus be adjusted by way of a variation of the characteristic curve.

The detectors are then equalized in such a way that the brightness histograms in all of the equalized individual images have, within a predefined first limit, widths identical to the width of the peak in the brightness histogram as identified by the double headed arrow in FIG. 4A. For this purpose, the gain of the detector respectively assigned to the respective individual image is correspondingly varied. In a subsequent second step of the detector equalization, the offset values of the detector characteristic curves are then varied in such a way that the peaks in the brightness histograms for all of the detectors assigned to the equalized individual images lie at the same brightness value or grey scale value within the second defined limits.

Figure 5A:
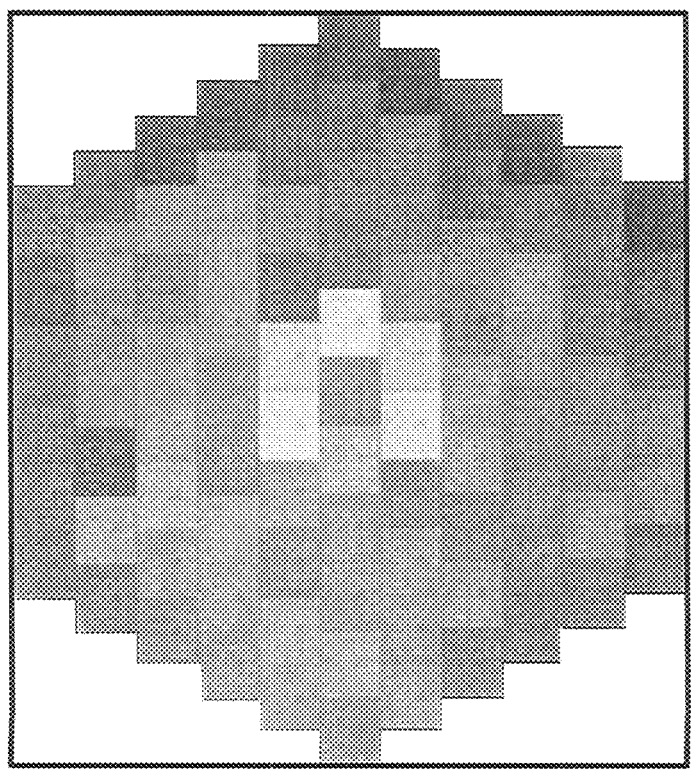
FIGS. 5A-5B show a full frame before and after a detector equalization.
Figure 5B:
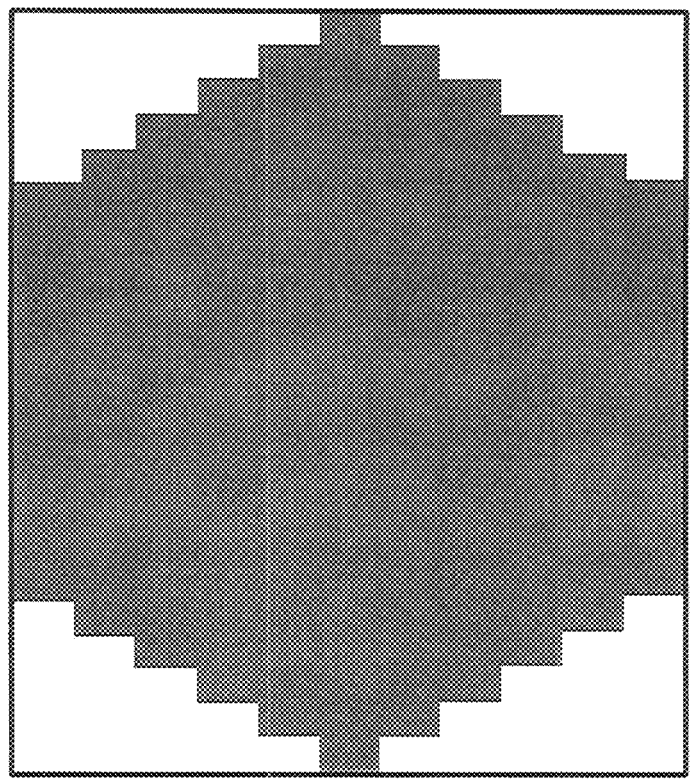

FIG. 5A-B shows by way of example a multi-image before and after a detector equalization. FIG. 5A illustrates the initial situation before the detector equalization. 91 individual images having different brightness values and having varying contrast are discernible. Here the individual images are chosen to be rectangular in each case. Each individual image was generated with the aid of a primary particle beam assigned to it. Overall, the arrangement of the 91 individual images produces a hexagonal structure suitable for the tessellation of an area.

FIG. 5B illustrates the situation after detector equalization has taken place. It is evident that each individual image has the same brightness value and the same contrast value within defined limits, i.e. within defined accuracy ranges. FIG. 5A-B thus illustrates the effectiveness of the described method for detector equalization.

Figure 6:
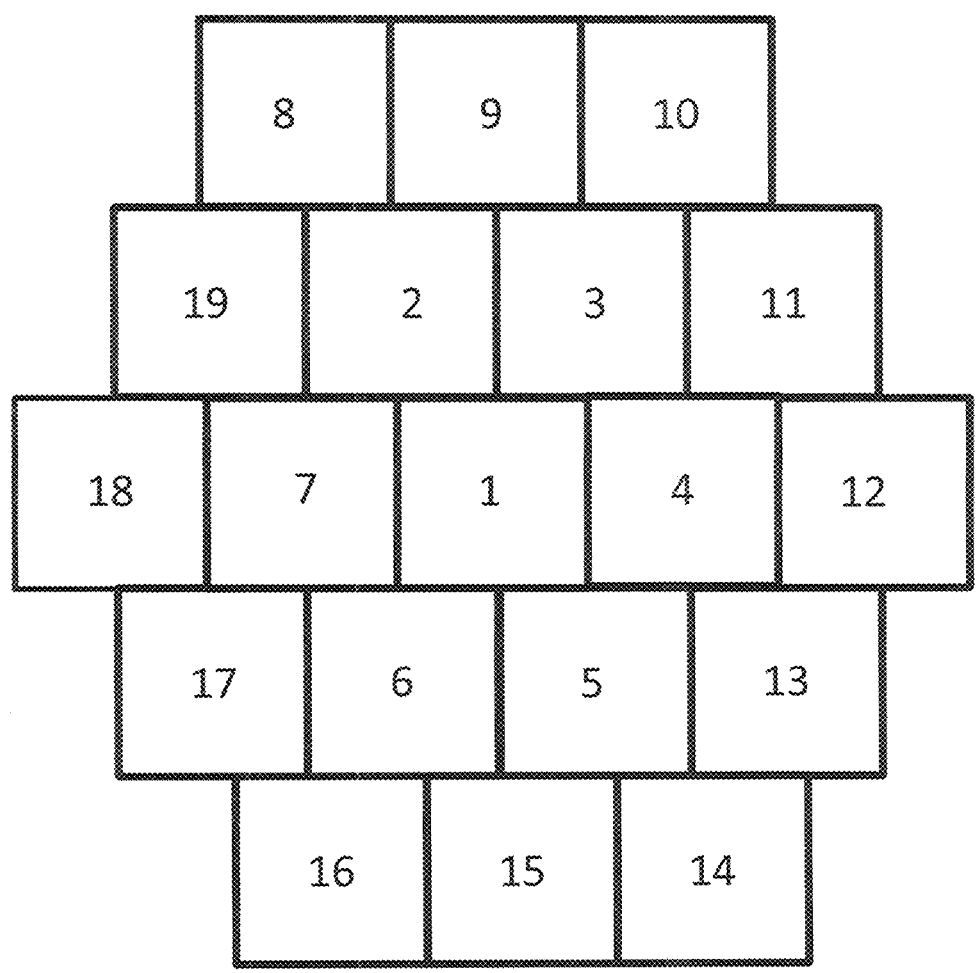
FIG. 6 shows one exemplary arrangement of rectangular individual images which overall form a hexagonal structure.
Figure 7:
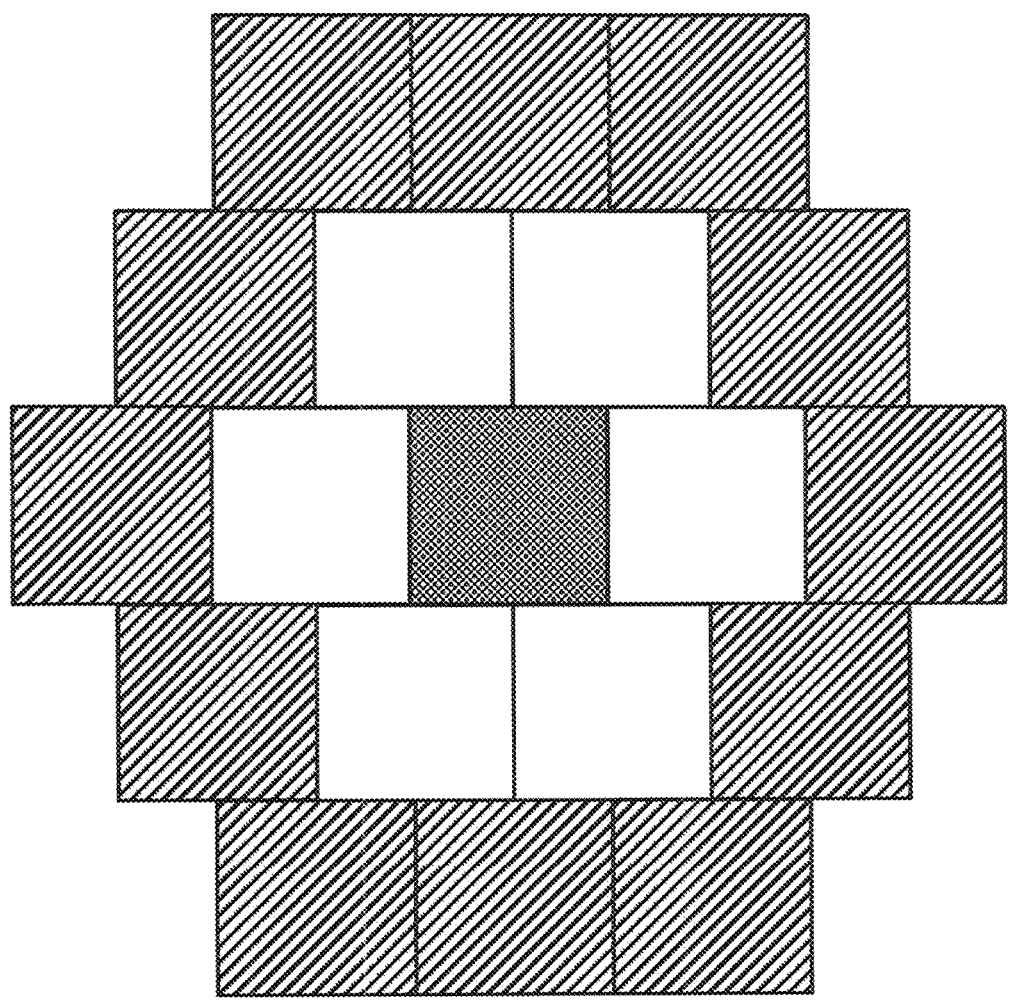
FIG. 7 illustrates the shell-like construction of the hexagonal structure from FIG. 6.

FIGS. 6 to 13 illustrate by way of example equalization strategies for embodiments of the disclosure which employ overlap regions between individual images. FIG. 6 firstly illustrates an arrangement of individual images 1 to 19, wherein the individual images are in each case rectangular, here approximately square. The individual images are suitable for the tessellation of the area and produce in their entirety once again an approximately hexagonal structure. This hexagonal structure can then be subdivided into various shells, as is illustrated by the differently hatched regions in FIG. 7. The innermost individual image 1 is illustrated here with black colouration. 6 further individual images bearing the numbers 2 to 7 (white) are arranged around the innermost individual image. A further shell comprising the individual images 8 to 19 (hatched) is arranged around this ring of individual images.

If a detector equalization is then carried out on the basis of the overlap regions between individual images, this can be carried out, as illustrated with reference to FIG. 8, proceeding from the innermost central individual image (individual image 1) in a shell like manner from the inner area outwards. In this case, the central individual image 1 serves as a reference. Specifically, the contrast and/or brightness values of the overlap individual images of individual image 1 are compared in each case with the contrast and/or brightness values of the overlap individual images of the individual images 2 to 7 and values for the equalization of the detectors assigned to the individual images 2 to 7 with regard to contrast and/or brightness are derived therefrom. Afterwards, the contrast and/or brightness values in the overlap individual images of the individual images 2 to 7 are then compared with the contrasts and/or brightness values in the individual images 8 to 19 adjacent to the individual images 2 to 7 in the respective overlap regions. In other words, the contrast and/or brightness values of the following individual images are then compared with one another: image 2 with image 8; image 3 with image 9 and image 3 with image 10; image 4 respectively with image 11, 12 and 13; image 5 with image 14; image 6 respectively with images 15 and 16; image 7 respectively with images 17, 18 and 19. Values for the equalization of the detectors assigned to the individual images 8 to 19 with regard to contrast and/or brightness are then obtained on the basis of the abovementioned comparisons of the contrast and/or brightness values in the respective overlap regions. In the case of the procedure described, following errors that possibly occur can be kept as small as possible. In other words, the detectors assigned to the outermost individual images or overlap individual images—as viewed from the central individual image 1—are equalized by the fewest possible intermediate steps proceeding from the central individual image 1. The individual images compared in each case with regard to their contrast and/or brightness values for the equalization of the detectors are identified by arrows in FIG. 8.

The contrast value and the brightness value of the central individual image 1 serve as reference values in the case of this equalization strategy. The detectors assigned to the individual images 2 to 19 are equalized by the gain and offset of the detectors assigned to the individual images 2 to 19 being changed in such a way that the peaks in the brightness histograms of the individual images 2 to 19, with the defined first limit, all have the same width or standard deviation as the peak in the brightness histogram of the central individual image 1 and the positions of the peaks in the brightness histograms of the individual images 2 to 19, within the defined second limit, all lie at the same grey scale value as the peak in the brightness histogram of the central individual image 1.

Figure 8:
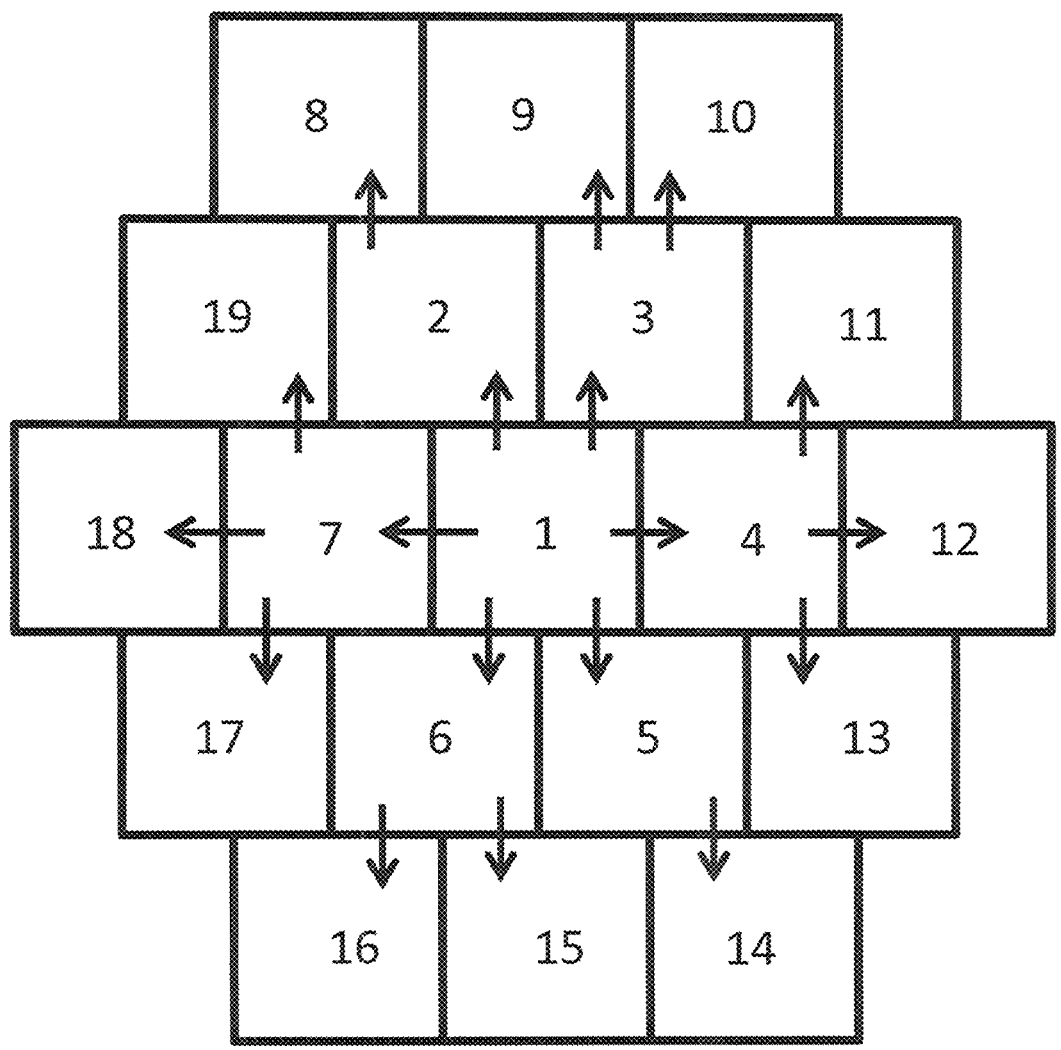
FIG. 8 shows a first possibility for a equalization path.
Figure 9:
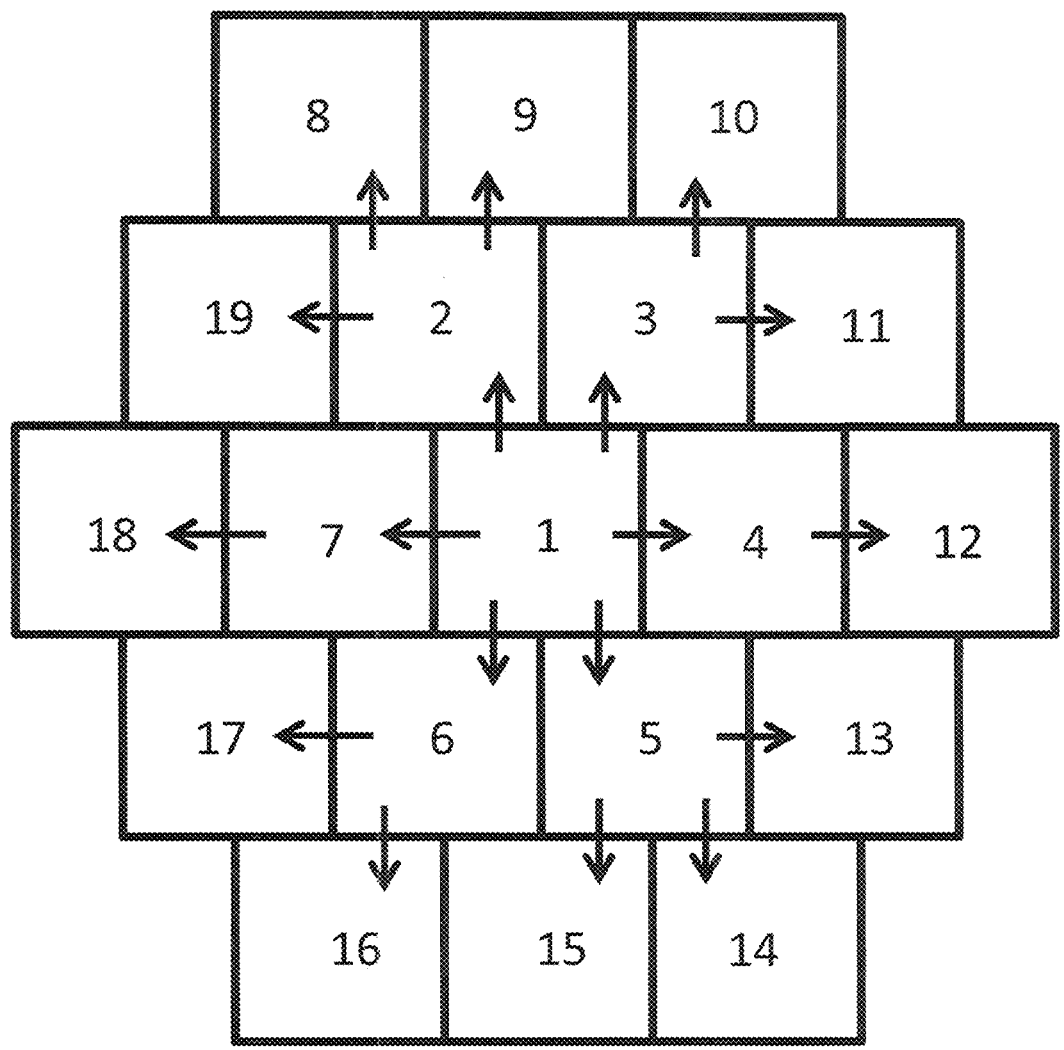
FIG. 9 shows an alternative possibility for a equalization path.

FIG. 9 shows a further equalization path as an alternative to the equalization path in FIG. 8, this further equalization path differing in its details from the equalization path shown in FIG. 8. The individual images compared in each case with regard to their contrast and/or brightness values for the equalization of the detectors are once again identified by arrows in FIG. 9. The equalization of the detectors assigned to the first shell, i.e. the individual images 2 to 7, is carried out in a manner identical to that described above in association with FIG. 8. However, there are a number of possibilities for equalizing the detectors assigned to the individual images 8 to 19 of the next shell. In FIG. 9, it is the case, for example, that proceeding from the individual image 5 the contrast and/or brightness values of the individual images 13, 14, 15 in the overlap regions are compared with the contrast and/or brightness values of the individual image 5 and values for the equalization of the contrast and/or brightness values of the detectors assigned to the individual images 13, 14 and 15 are obtained therefrom. In a similar manner, the contrast and/or brightness values of the individual images 8, 9 and 19 in the overlap regions are compared with the contrast and/or brightness values of the individual image 2 and values for the equalization of the contrast and/or brightness values of the detectors assigned to the individual images 8, 9 and 19 are obtained therefrom. By contrast, it is the case that, for example, the contrast and/or brightness values of the individual image 7 are used only for the equalization of the detector assigned to the individual image 18. However, even with this definition of the individual images to be compared for the detector equalization, following errors can be kept as small as possible.

Figure 10A:
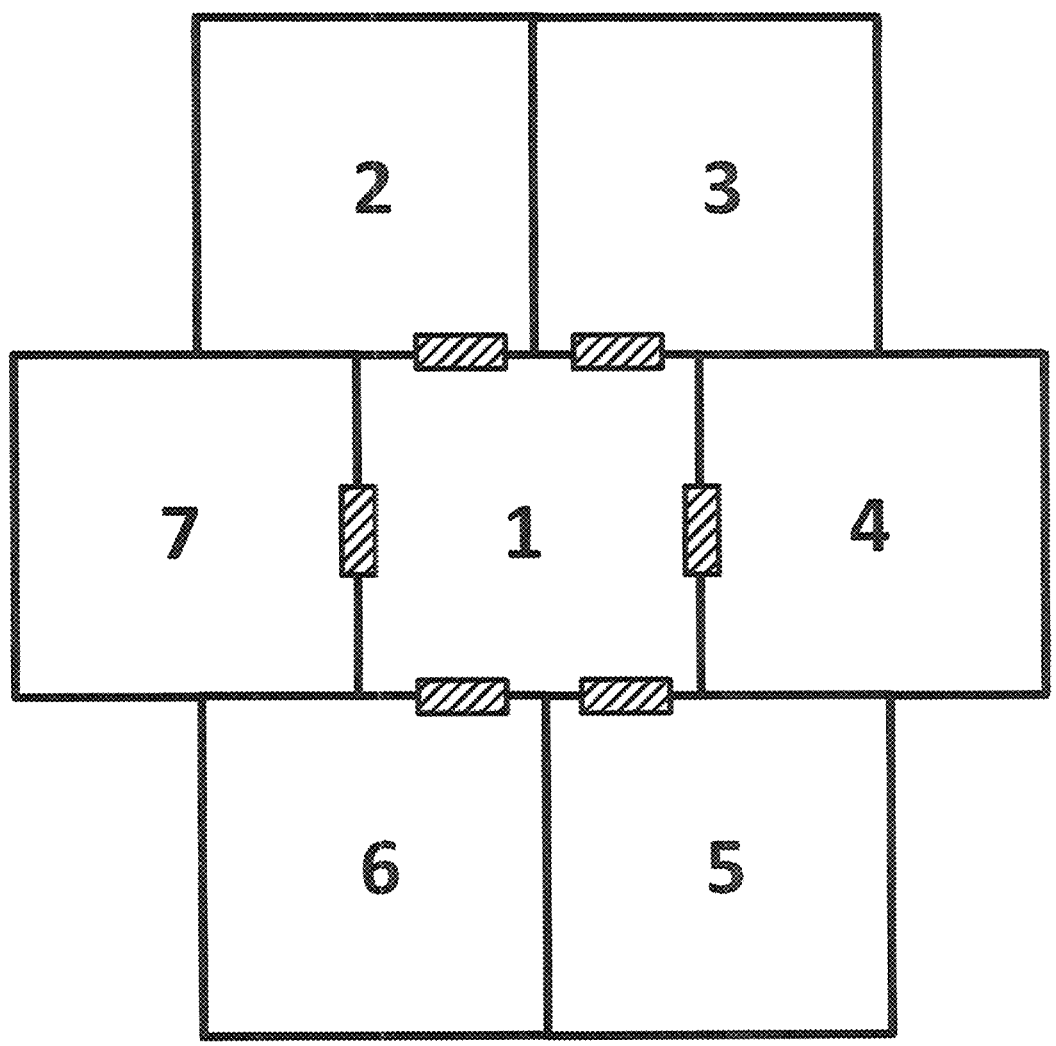
FIG. 10A illustrates overlap regions between individual images.

FIG. 10A illustrates the equalization via the overlap individual images on the basis of an enlarged excerpt from FIG. 6. The black rectangles depicted in FIG. 10A between the central individual image 1, on the one hand, and the first shell having the individual images 2 to 7, on the other hand, illustrate the overlap individual images. In the example shown, the overlap individual images are in each case dimensioned identically, but oriented differently in part. In the example shown, the situation is that the overlap individual images respectively corresponding to one another are of the same size in each case. It is assumed that the overlap sample regions represented by the overlap individual images have at least approximately the same secondary electron yield and variations in brightness and/or contrast in the overlap individual images assigned to one another are caused by different detector characteristic curves in the individual images. It is thus sufficient here to carry out an equalization on the basis of the contrast and/or brightness values in the overlap individual images assigned to one another. In particular, the lengths of the overlap individual images are chosen such that they extend in each case only over a part of the length of the respective boundary between adjacent individual images.

Figure 10B:
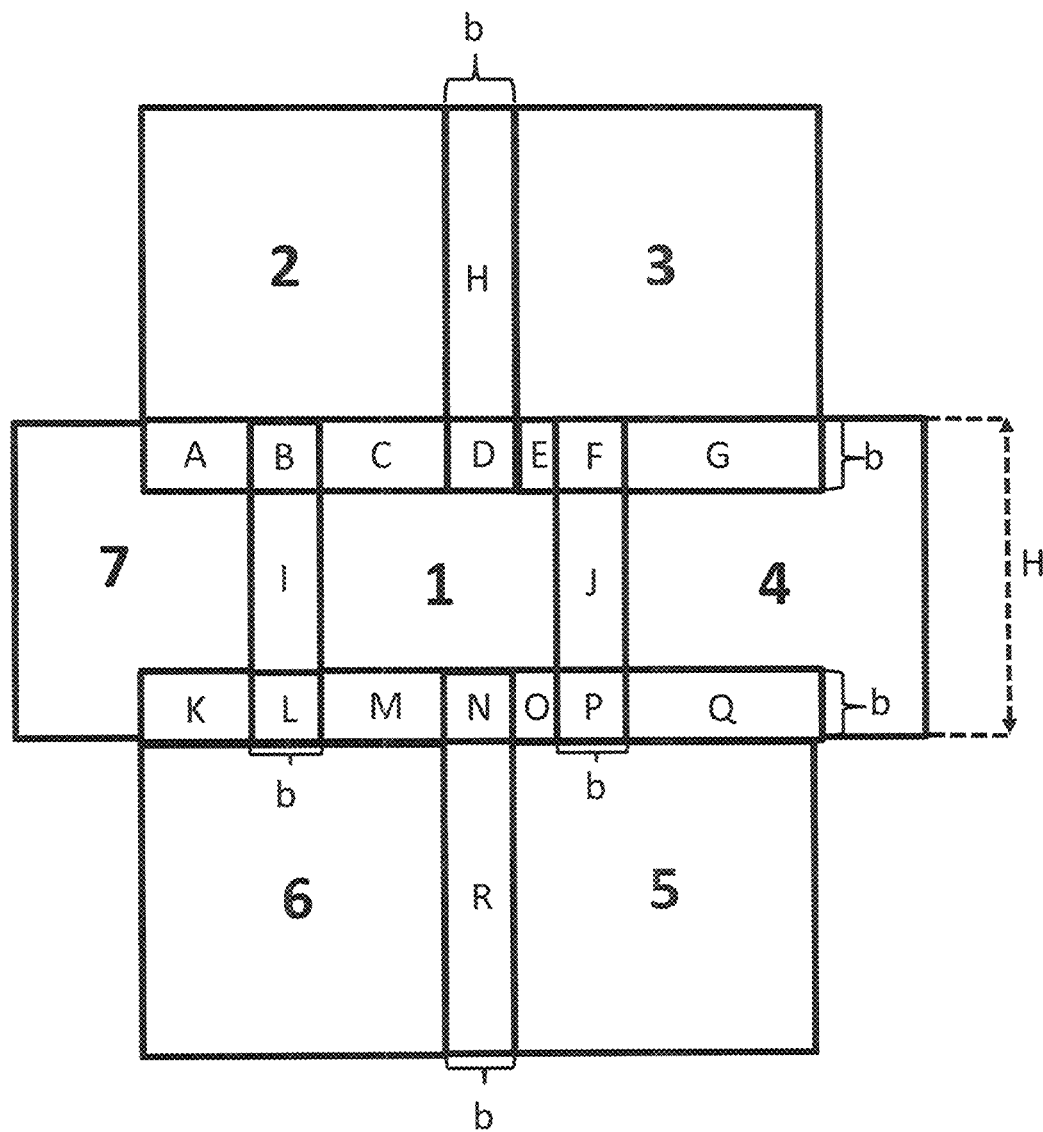
FIG. 10B illustrates alternative overlap regions between individual images.

FIG. 10B illustrates alternative overlap regions between individual images. Individual images 1 to 7 are illustrated, which are each approximately square in the example shown here. However, they could also be rectangular, for example. The individual images 1 to 7 then each have overlap regions with respect to the individual images adjacent to them. In the example shown, the overlap regions are embodied in strip-shaped fashion, in each case with a width b. The width b of all of the overlap regions is identical here; however, it could also vary from overlap region to overlap region. In FIG.

10B, the strip-shaped overlap regions are designated by the letters A to R in their different sections in order to be able to better explain hereinafter the detector equalization on the basis of the overlap regions. The method once again proceeds from the central individual image 1, the contrast and/or brightness values of which are intended to be compared firstly within the shared overlap region with the individual image 2. The individual images 1 and 2 then have the shared overlap region B-C-D. The regions B-C-D can thus define overlap individual images and the brightness and/or contrast values in these overlap regions B-C-D can be compared with one another. Theoretically it would also be possible to define only a subselection of the regions B-C-D, that is to say e.g. B-C, C-D, B-D or even only B, C or D in isolation as overlap region and to carry out the comparison of the brightness and/or contrast values only in these partial regions. However, care should be taken to ensure that the brightness and/or contrast values of a sufficiently large number of pixels are compared for the equalization. In this respect, it can be advantageous and also comparatively simple in terms of the method implementation if the overlap region theoretically completely present between two individual images is actually used completely for the detector equalization.

In a next step, the individual images 1 and 3, in their overlap region, can also be compared with one another with regard to brightness and/or contrast for the detector equalization of the detector assigned to the individual image 3. This then includes the regions D-E-F or a selection thereof. Furthermore, the individual image 1 can be compared with individual image 4 in the overlap region F-J-P or parts thereof in order to obtain values for an equalization of the detector assigned to the individual image 4. An equalization of the detector assigned to the individual image 5 with the detector assigned to the individual image 1 can be carried out by way of the overlap region N; O; P or parts thereof. An equalization of the detector assigned to the individual image 6 with the detector assigned to the individual image 1 can in turn be carried out by way of the shared overlap region L-M-N or parts thereof. An equalization of the detector assigned to the individual image 7 with the detector assigned to the individual image 1 can in turn be carried out by way of the shared overlap regions B-I-L or parts thereof. Other equalization paths are also possible in principle. In this regard, the detector assigned to the individual image 3 could e.g. not be equalized directly with individual image 1 by way of the shared overlap region, rather the detector assigned to the individual image 3 could also be equalized by way of overlap regions with the detector assigned to the individual image 2, already equalized previously. The shared overlap region H-D or parts thereof would be available for this purpose. Such an equalization can provide the disadvantage, however, that a following error increases, which should ideally be kept as small as possible. In this respect, an equalization of the individual images 2 to 7 of the shell that directly surrounds the central individual image 1 directly on the basis of the overlap regions with the central individual image 1 by way of the shared overlap regions respectively present is suitable. The further equalization of additional individual images can then in turn be carried out in a shell-like procedure from the inner area outwards (not illustrated).

The overlap regions shown in FIG. 10B arise upon individual images or associated individual field regions of the sample being slightly superimposed or put above one another in a very simple and elegant manner. In the case of an image field of approximately 12 µm×10.5 µm, the width b of the overlap strips is approximately 0.5 µm, for example. In accordance with embodiments, the width b of an overlap strip or of a rectangular overlap region is ≥1% and ≤10% of the corresponding image height or image width H, that is to say 1% H≤b≤10% H; such as 1% H≤b≤7% H and 3% H≤b≤5% H.

Figure 11:
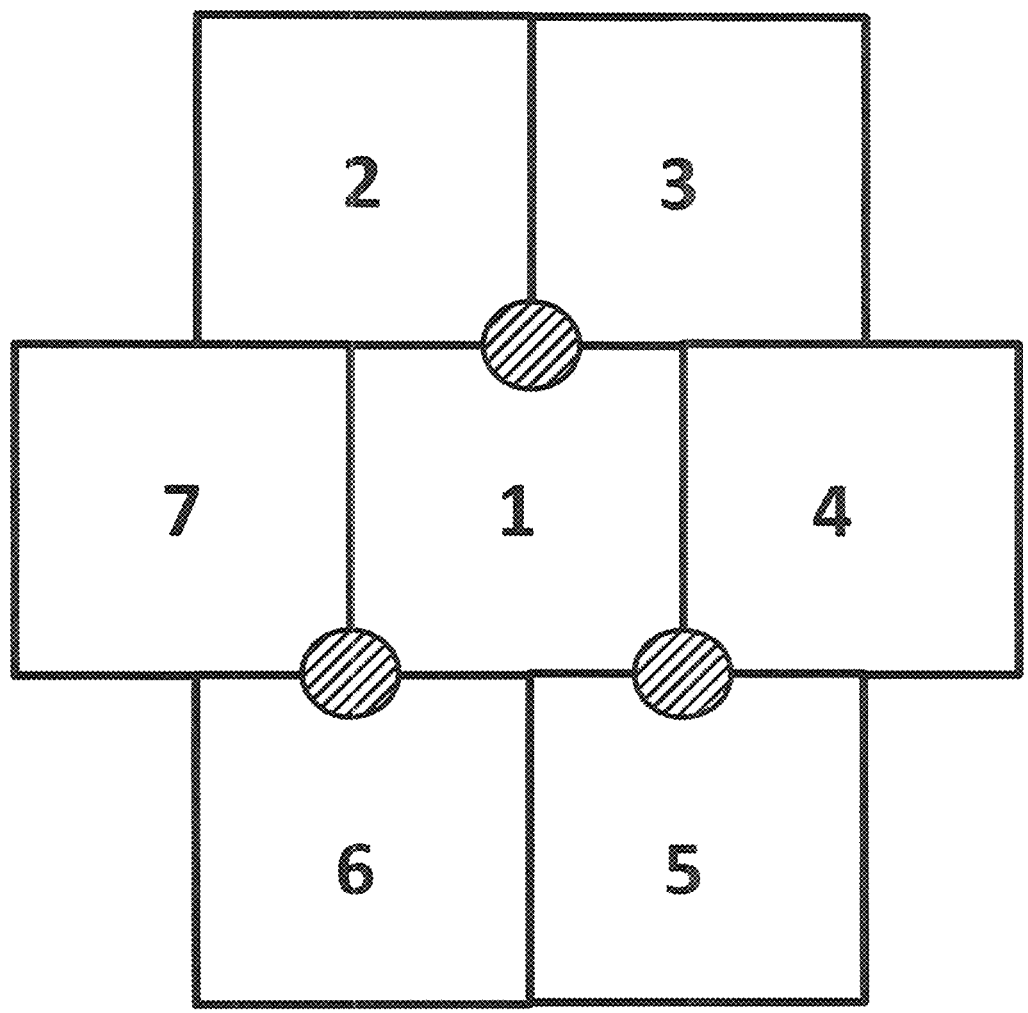
FIG. 11 shows alternative overlap regions between individual images.
Figure 12:
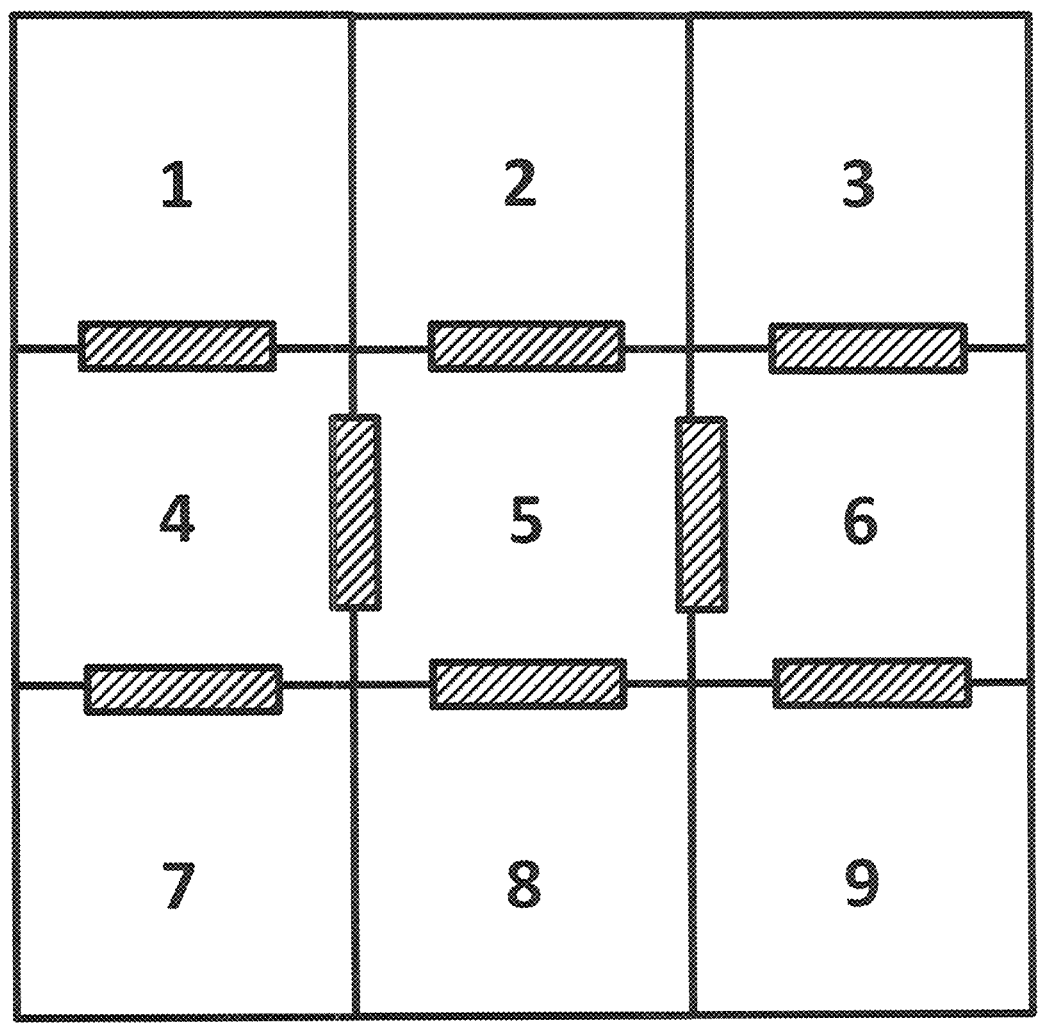
FIG. 12 illustrates a different arrangement of individual images and overlap regions used here for the detector equalization.

FIG. 11 shows an alternative embodiment variant of the disclosure comprising in each case three overlap individual images corresponding to one another. The overlap individual images in FIG. 11 are illustrated by the black circles. It would also be possible to choose a different shaping for the overlap individual images, e.g. a rectangular shape. It is important for there to be a sufficient number of data points present in each overlap individual image in order that the statistical evaluation of brightness and/or contrast in the overlap individual images also has the desired meaningfulness.

In FIGS. 6 to 11, in each case the situation is that the illustrated individual images together with the respectively adjacent individual images—quite apart from the overlap regions—have not just a shared corner point but shared edges with one another. In this respect, the rectangular individual images are arranged in a manner displaced relative to one another like a wall in a plurality of layers. This is different in the exemplary embodiment shown in FIG. 12: the latter involves rectangular individual images 1 to 9 that are arranged in three rows arranged one above one another and themselves form a large rectangle. With such an arrangement of individual images as well, the overlap regions can be employed during the detector equalization. Here once again it is possible to proceed from a central individual image 5 with its four overlap individual images, which respectively form overlap individual images with the individual images 2, 4, 6 and 8 directly surrounding the central individual image. After the equalization of the detectors assigned to this cross-like inner structure of the individual images, the detectors assigned to the individual images 1, 3, 7 and 9 lying at the corners can then each be equalized in turn by way of the evaluation of the contrast and brightness values in corresponding overlap regions with the individual images 4, 6 adjacent to them.

Figure 13:
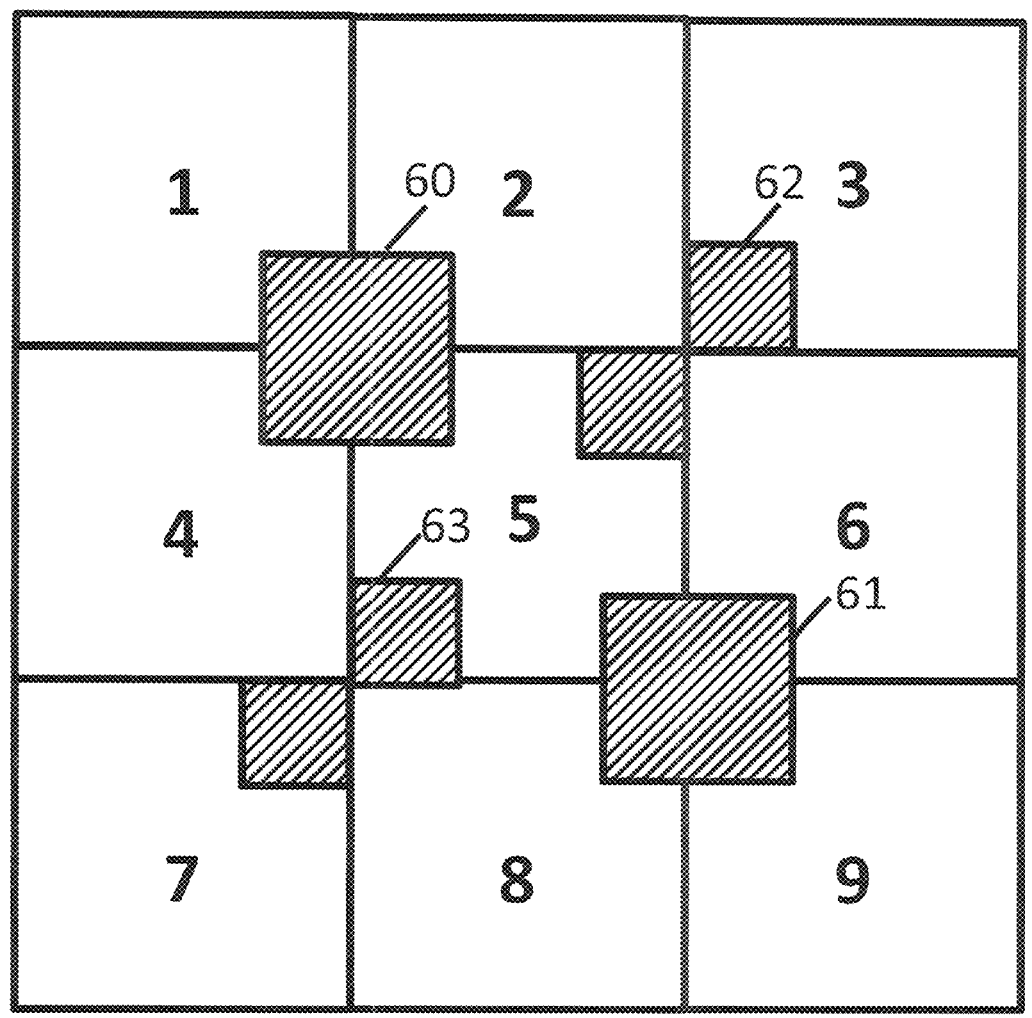
FIG. 13 illustrates various overlap regions between individual images.

FIG. 13 shows a further alternative embodiment variant of the disclosure comprising differently dimensioned overlap individual images. In this case, the overlap individual images 60 and 61 are square and have four overlap individual images assigned to one another. By contrast, the overlap individual images 62 and 63 here have only half the area of the overlap individual images 60 and 61 and only in each case two overlap individual images assigned to one another are present here. In the case of the large overlap individual images 60 and 61, in each case 4 detectors or 4 conversion channels of a detector contribute to the image of the overlap individual image and are equalized with one another—proceeding from the central individual image 5 as a reference. In each case only two individual images contribute to the smaller overlap individual images 62 and 63, and are equalized in each case with the overlap individual image of the individual image 5 (overlap individual images of the individual images 3 and 7). In the example shown, therefore, ultimately all the detectors assigned to the outer individual images are equalized on the basis of the brightness and/or contrast values in overlap regions with the central individual image 5.

The embodiment variants described should be understood to be merely by way of example and can be wholly or partly combined with one another, provided that no technical contradictions at all arise as a result.

What is claimed is:

1. A method, comprising:
   irradiating an object with a multiplicity of primary particle beams, each primary particle beam irradiating a separate individual field region of the object in a scanning fashion;
   projecting interaction products, which emanate from the object due the primary particle beams, onto detection regions of a detection unit which comprises a detector so that the interaction products emanating from two different individual field regions are projected onto different detection regions;
   generating individual images from each of the individual field regions based on data which are obtained or have been obtained in each case with the aid of signals from the detection regions; and
   equalizing the detection unit with its plurality of detection regions by adjusting the detection unit so that:
      a first predetermined multiplicity of the individual images have the same contrast value to within 10% of a reference contrast value; and
      a second predetermined multiplicity of the individual images have the same brightness value to within 10% of a reference brightness value,
   wherein adjusting the detection unit comprises adjusting a gain and/or adjusting an offset for at least some detection regions of the detection unit.

2. The method of claim 1, comprising simultaneously irradiating the object with the multiplicity of primary particle beams.

3. The method of claim 1, comprising adjusting the detection unit so that all the individual image have the same contrast value within a defined first limit.

4. The method of claim 1, further comprising repeating at least part of the method.

5. The method of claim 1, further comprising testing settings of the detection unit by repeating at least part of the method.

6. The method of claim 1, further comprising using a quality criterion to determine whether a detector equalization is successful.

7. The method of claim 1, wherein:
   interaction products are projected onto detection regions of a particle detector;
   light signals are emitted by each detection region of the particle detector upon interaction products impinging on said detection region;
   the light signals emitted by each detection region are fed to a light detector assigned to the respective detection region; and
   adjusting the detection unit comprises adjusting the light detectors.

8. The method of claim 7, wherein:
   the light detectors comprise avalanche photodiodes, and
   adjusting the avalanche photodiodes comprises adjusting a gain and/or adjusting an offset.

9. The method of claim 1, wherein the object comprises a plurality of structurally identical test regions.

10. The method of claim 9, further comprising testing settings of the detection unit on the basis of a real sample.

11. The method of claim 1, comprising generating the individual images in parallel on image generating computers respectively assigned to detection regions of the detection unit.

12. The method of claim 11, comprising performing calculations to determine the contrast values in parallel on the image generating computers.

13. The method of claim 1, comprising using a computer system to control adjusting the detection unit.

14. The method of claim 1, further comprising, after adjusting the detection unit, performing image processing to improve contrast and/or brightness.

15. The method of claim 1, wherein:
   a mean value of a Gaussian distribution in a brightness histogram is defined as brightness value for each individual image; and/or
   a multiple of the standard deviation of the Gaussian distribution in the brightness histogram is defined as a contrast value for each individual image.

16. A system comprising:
   one or more processing devices; and
   one or more machine-readable hardware storage devices comprising instructions that are executable by the one or more processing devices to perform operations comprising the method of claim 1.

17. The system of claim 16, further comprising a multi-beam particle microscope comprising a multi-beam particle optical assembly comprising a detection unit.

18. One or more machine-readable hardware storage devices comprising instructions that are executable by one or more processing devices to perform operations comprising the method of claim 1.

19. The method of claim 10, further comprising:
   irradiating the test regions with a multiplicity of primary particle beams, each primary particle beam irradiating a separate individual test region of the object in a scanning fashion;
   projecting interaction products, which emanate from the test regions due the primary particle beams, onto a plurality of detection regions of a detection unit which comprises a detector so that the interaction products emanating from two different individual test regions are projected onto different detection regions;
   generating individual test images from each of the individual test regions based on data which are obtained or have been obtained in each case with the aid of signals from the detection regions;
   determining a contrast and/or a brightness of the individual test images;
   based on the contrast and/or the brightness of the individual test images, equalizing the detection unit with its plurality of detection regions by adjusting the detection unit by adjusting a gain of the detection unit and/or adjusting an offset of the detection unit; and
   after equalizing the detection unit by adjusting the detection unit:
      irradiating the real sample with the multiplicity of primary particle beams, each primary particle beam irradiating a separate individual field region of the real sample in a scanning fashion;
      projecting interaction products, which emanate from the real sample due the primary particle beams, onto the plurality of detection regions of the detection unit so that the interaction products emanating from two different individual field regions are projected onto different detection regions; and
      generating individual images from each of the individual field regions based on data which are obtained or have been obtained in each case with the aid of signals from the detection regions.

20. A method, comprising:
irradiating a test sample with a multiplicity of primary particle beams, each primary particle beam irradiating a separate individual test field region of the object in a scanning fashion;
projecting interaction products, which emanate from the test sample due the primary particle beams, onto a plurality of detection regions of a detection unit which comprises a detector so that the interaction products emanating from two different individual test field regions are projected onto different detection regions;
generating individual test images from each of the individual test field regions based on data which are obtained or have been obtained in each case with the aid of signals from the detection regions;
determining a contrast and/or a brightness of the individual test images;
based on the contrast and/or the brightness of the individual test images, equalizing the detection unit with its plurality of detection regions by adjusting the detection unit by adjusting a gain of the detection unit and/or adjusting an offset of the detection unit; and
after equalizing the detection unit by adjusting the detection unit:
irradiating a real sample with the multiplicity of primary particle beams, each primary particle beam irradiating a separate individual field region of the real sample in a scanning fashion;
projecting interaction products, which emanate from the real sample due the primary particle beams, onto the plurality of detection regions of the detection unit so that the interaction products emanating from two different individual field regions are projected onto different detection regions; and
generating individual images from each of the individual field regions based on data which are obtained or have been obtained in each case with the aid of signals from the detection regions.

21. The method of claim 20, wherein due to adjusting the detection unit:
all contrast values of the individual test images are within 10% of a reference contrast value; and
all brightness values of the individual test images are within 10% of a reference brightness value.

* * * * *

UNITED STATES PATENT AND TRADEMARK OFFICE
CERTIFICATE OF CORRECTION

PATENT NO. : 11,645,740 B2
APPLICATION NO. : 17/192637
DATED : May 9, 2023
INVENTOR(S) : Dirk Zeidler et al.

It is certified that error appears in the above-identified patent and that said Letters Patent is hereby corrected as shown below:

In the Specification

Column 8, Line 43, delete "visa" insert -- vis à --.

Column 12, Line 4, delete "12" insert -- $I_2$ --.

Column 12, Line 21, delete "13" insert -- $I_3$ --.

Column 16, Line 52, delete "FIG." insert -- FIGS. --.

Column 16, Line 65, delete "FIG." insert -- FIGS. --.

In the Claims

Column 21, Claim 1, Line 8, delete "due the primary" insert -- due to the primary --.

Column 22, Claim 19, Line 34, delete "due the primary" insert -- due to the primary --.

Column 22, Claim 19, Line 59, delete "due the primary" insert -- due to the primary --.

Column 23, Claim 20, Line 7, delete "due the primary" insert -- due to the primary --.

Column 24, Claim 20, Line 8, delete "due the primary" insert -- due to the primary --.

Signed and Sealed this
Twenty-seventh Day of June, 2023

Katherine Kelly Vidal
*Director of the United States Patent and Trademark Office*